(12) United States Patent
Kim et al.

(10) Patent No.: US 12,439,698 B2
(45) Date of Patent: Oct. 7, 2025

(54) DISPLAY DEVICE

(71) Applicant: Samsung Display Co., LTD., Yongin-si (KR)

(72) Inventors: Dong-Hwi Kim, Osan-si (KR); Jin Jeon, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 18/914,506

(22) Filed: Oct. 14, 2024

(65) Prior Publication Data

US 2025/0040252 A1    Jan. 30, 2025

Related U.S. Application Data

(63) Continuation of application No. 18/136,756, filed on Apr. 19, 2023, now Pat. No. 12,148,763, which is a
(Continued)

(30) Foreign Application Priority Data

Feb. 27, 2020    (KR) ........................ 10-2020-0024388

(51) Int. Cl.
*G09G 3/32*    (2016.01)
*H10D 86/40*    (2025.01)
(Continued)

(52) U.S. Cl.
CPC .............. *H10D 86/60* (2025.01); *G09G 3/32* (2013.01); *H10D 86/441* (2025.01); *G09G 2300/0426* (2013.01); *G09G 2300/0809* (2013.01); *G09G 2310/0243* (2013.01); *G09G 2310/0267* (2013.01); *H10H 29/142* (2025.01);
(Continued)

(58) Field of Classification Search
CPC ........ H10D 86/60; H10D 86/441; G09G 3/32; G09G 2300/0426; G09G 2300/0809; G09G 2310/0243; G09G 2310/0267; G09G 2300/0852; G09G 2310/0251; G09G 2310/0262; G09G 2340/0407; G09G 3/3233; H10H 29/142; H10K 59/1213; H10K 59/1216; H10K 59/131;
(Continued)

(56) References Cited

U.S. PATENT DOCUMENTS

| 8,287,425 B2 | 10/2012 | Omote et al. |
| 9,866,660 B2 | 1/2018 | Myers et al. |

(Continued)

FOREIGN PATENT DOCUMENTS

| CN | 107527591 A | 12/2017 |
| CN | 107544166 A | 1/2018 |

(Continued)

*Primary Examiner* — Pegeman Karimi
(74) *Attorney, Agent, or Firm* — CANTOR COLBURN LLP

(57) ABSTRACT

A display device includes a first region and a second region each including a plurality of pixels, and a plurality of wires connected to the plurality of pixels, respectively, to transmit a signal, where the number of pixels per unit area in the second region is less than the number of pixels per unit area in the first region, and the number of wires per unit area in the second region is less than the number of wires per unit area in the first region.

13 Claims, 30 Drawing Sheets

Related U.S. Application Data continuation of application No. 17/555,370, filed on Dec. 17, 2021, now Pat. No. 11,670,644, which is a continuation of application No. 16/996,504, filed on Aug. 18, 2020, now Pat. No. 11,244,967.

(51) Int. Cl.
  *H10D 86/60* (2025.01)
  *H10H 29/14* (2025.01)
  *H10K 59/121* (2023.01)
  *H10K 59/131* (2023.01)
  *H10K 59/35* (2023.01)

(52) U.S. Cl.
  CPC ..... *H10K 59/1213* (2023.02); *H10K 59/1216* (2023.02); *H10K 59/131* (2023.02); *H10K 59/35* (2023.02)

(58) Field of Classification Search
  CPC ........ H10K 59/35; H10K 50/80; H10K 59/00; G09F 9/33; G09F 9/35
  See application file for complete search history.

(56) References Cited

U.S. PATENT DOCUMENTS

| | | | |
|---|---|---|---|
| 10,319,306 B2 | 6/2019 | Jeong et al. | |
| 10,490,617 B2 | 11/2019 | Kim et al. | |
| 10,650,739 B2* | 5/2020 | Kim | G09G 3/3233 |
| 10,879,332 B2 | 12/2020 | Gu et al. | |
| 11,011,595 B2 | 5/2021 | Lee et al. | |
| 11,030,953 B2 | 6/2021 | Kim et al. | |
| 11,263,968 B2 | 3/2022 | Wang et al. | |
| 11,315,469 B2 | 4/2022 | Li et al. | |
| 11,348,402 B2 | 5/2022 | Ceniceroz et al. | |
| 11,444,130 B2 | 9/2022 | Tan | |
| 11,468,838 B2 | 10/2022 | Kim et al. | |
| 11,538,392 B2 | 12/2022 | Li et al. | |
| 11,562,680 B2 | 1/2023 | Li et al. | |
| 11,659,743 B2 | 5/2023 | Lee et al. | |
| 11,710,455 B2 | 7/2023 | Jeong et al. | |
| 11,922,883 B2 | 3/2024 | Jeong et al. | |
| 2008/0303776 A1 | 12/2008 | Jung | |
| 2012/0062545 A1 | 3/2012 | Kim | |
| 2014/0092355 A1 | 4/2014 | Teranuma et al. | |
| 2014/0299843 A1 | 10/2014 | Kim | |
| 2015/0364091 A1 | 12/2015 | Won et al. | |
| 2017/0365218 A1 | 12/2017 | Jeong et al. | |
| 2018/0006105 A1 | 1/2018 | Kim et al. | |
| 2018/0040682 A1 | 2/2018 | Ebisuno et al. | |
| 2019/0051672 A1 | 2/2019 | Lee et al. | |
| 2019/0295471 A1 | 9/2019 | Jeong et al. | |
| 2019/0304361 A1* | 10/2019 | Lu | H10K 59/1216 |
| 2019/0304366 A1* | 10/2019 | Ka | H10K 59/1213 |
| 2019/0377923 A1 | 12/2019 | Chen et al. | |
| 2020/0043994 A1 | 2/2020 | Chen et al. | |
| 2020/0044009 A1* | 2/2020 | Kwak | H10K 59/131 |
| 2020/0227488 A1* | 7/2020 | Xin | H10K 59/352 |
| 2020/0279874 A1 | 9/2020 | Kawashima et al. | |
| 2021/0065625 A1 | 3/2021 | Wang et al. | |
| 2022/0254225 A1 | 8/2022 | Ceniceroz et al. | |
| 2022/0254296 A1 | 8/2022 | Li et al. | |
| 2022/0277616 A1 | 9/2022 | Ceniceroz et al. | |
| 2023/0053847 A1 | 2/2023 | Kim et al. | |
| 2023/0078129 A1 | 3/2023 | Li et al. | |
| 2024/0066427 A1 | 2/2024 | Fich et al. | |
| 2024/0203355 A1 | 6/2024 | Jeong et al. | |

FOREIGN PATENT DOCUMENTS

| | | |
|---|---|---|
| CN | 108735790 A | 11/2018 |
| CN | 209070895 U | 7/2019 |
| CN | 110379356 A | 10/2019 |
| CN | 110444125 A | 11/2019 |
| CN | 110797373 A | 2/2020 |
| EP | 3258463 | 12/2017 |
| JP | 2010243520 A | 10/2010 |
| KR | 1020050005646 A | 1/2005 |
| KR | 101169053 B1 | 7/2012 |
| KR | 1020160147116 A | 12/2016 |
| KR | 1020170113066 A | 10/2017 |
| KR | 1020180025354 A | 3/2018 |
| KR | 1020180112158 A | 10/2018 |
| KR | 1020190034375 A | 4/2019 |
| KR | 1020190087695 A | 7/2019 |
| KR | 20190114066 A | 10/2019 |
| WO | 2019242510 A1 | 12/2019 |

* cited by examiner

DISPLAY DEVICE

This application is a continuation of U.S. patent application Ser. No. 18/136,756, filed on Apr. 19, 2023, which is a continuation of U.S. patent application Ser. No. 17/555,370, filed on Dec. 17, 2021, which is a continuation of U.S. patent application Ser. No. 16/996,504, filed on Aug. 18, 2020, which claims priority to Korean Patent Application No. 10-2020-0024388 filed on Feb. 27, 2020, and all the benefits accruing therefrom under 35 U.S.C. § 119, the content of which in its entirety is herein incorporated by reference.

BACKGROUND

1. Field

The present disclosure relates to a display device.

2. Description of the Related Art

A display device is a device for displaying an image, and includes a liquid crystal display ("LCD"), an organic light emitting diode ("OLED") display, or the like. The display device is used in various electronic devices such as a mobile phone, a navigation device, a digital camera, an electronic book, a portable game machine, and various terminals.

The display device may include a plurality of pixels, and within each pixel, various elements such as transistors and capacitors and various wires capable of supplying signals to these elements may be positioned. It may not be easy to secure transmittance by these elements and wires.

In the display device, parts such as a camera may be disposed in some regions surrounded by a region where a screen is displayed. In general, the pixels are not formed in the region where these parts are disposed, so the screen may not be displayed. As a result, it is recognized that a black hole is disposed in some region of the screen, which may interfere when viewing the image.

SUMMARY

An exemplary embodiment is to provide a display device in which a screen may be displayed in some regions of the display device in which parts such as a camera are disposed.

In addition, an exemplary embodiment is to provide a display device that may increase transmittance of a corresponding region so as to not affect a function of the parts and have high luminance so that a corresponding region is not distinguished from other adjacent regions.

A display device according to an exemplary embodiment includes a first region and a second region each including a plurality of pixels, and a plurality of wires connected to the plurality of pixels, respectively, to transmit a signal, where the number of pixels per unit area in the second region is less than the number of pixels per unit area in the first region, and the number of wires per unit area in the second region is less than the number of wires per unit area in the first region.

The plurality of wires may include a plurality of first initialization voltage supply lines which supplies a first initialization voltage, and a plurality of second initialization voltage supply lines which supplies a second initialization voltage, and the number of first initialization voltage supply lines and second initialization voltage supply lines per unit area in the second region may be smaller than the number of first initialization voltage supply lines and second initialization voltage supply lines per unit area in the first region.

The number of the pixels per unit area in the second region may be one sixth or more and half or less of the number of pixels per unit area in the first region, and the number of first initialization voltage supply lines and second initialization voltage supply lines per unit area in the second region may be one sixth or more of and less than the number of first initialization voltage supply lines and second initialization voltage supply lines per unit area in the first region.

The number of pixels per unit area in the second region may be one quarter of the number of pixels per unit area in the first region, and the number of first initialization voltage supply lines and second initialization voltage supply lines per unit area in the second region may be half of the number of first initialization voltage supply lines and second initialization voltage supply lines per unit area in the first region.

Each of the plurality of pixels may include a light emitting diode ("LED") connected between a driving voltage line to which a driving voltage is applied and a common voltage line to which a common voltage is applied; a driving transistor connected between the driving voltage line and the light emitting diode (LED); a second transistor connected between a first electrode of the driving transistor and a data line to which a data voltage is applied, where the first electrode of the driving transistor is connected to the driving voltage line; a third transistor connected between a second electrode of the driving transistor and a gate electrode of the driving transistor, where the second electrode of the driving transistor is connected to the light emitting diode (LED); a fourth transistor connected between the gate electrode of the driving transistor and a first initialization voltage line to which the first initialization voltage is applied; and a seventh transistor connected between the light emitting diode (LED) and a second initialization voltage line to which the second initialization voltage is applied.

The number of pixels per unit area in the second region may be one quarter of the number of pixels per unit area in the first region, the number of first initialization voltage supply lines per unit area in the second region may be one quarter of the number of first initialization voltage supply lines and second initialization voltage supply lines per unit area in the first region, and the second initialization voltage supply lines may not be disposed in the second region.

Each of the plurality of pixels of the first region may include a light emitting diode (LED) connected between a driving voltage line to which a driving voltage is applied and a common voltage line to which a common voltage is applied; a driving transistor connected between the driving voltage line and the light emitting diode (LED); a second transistor connected between a first electrode of the driving transistor and a data line to which a data voltage is applied, where the first electrode of the driving transistor is connected to the driving voltage line; a third transistor connected between a second electrode of the driving transistor and a gate electrode of the driving transistor, where the second electrode of the driving transistor is connected to the light emitting diode (LED); a fourth transistor connected to the gate electrode of the driving transistor and a first initialization voltage line to which the first initialization voltage is applied; and a seventh transistor connected between the light emitting diode (LED) and a second initialization voltage line to which the second initialization voltage is applied, and each of the plurality of pixels of the second region may include the light emitting diode (LED), the driving transistor, the second transistor, the third transistor, the fourth transistor, and a seventh transistor connected between the light emitting diode (LED) and the first initialization voltage line.

The display device according to an exemplary embodiment may further include at least one of a camera, a proximity sensor, an illuminance sensor, a gesture sensor, a motion sensor, a fingerprint sensor, and a biometric sensor, or a combination thereof, disposed in the second region.

A display device according to an exemplary embodiment includes a plurality of pixels; a plurality of first scan lines connected to the plurality of pixels to transmit a first scan signal; a plurality of second scan lines connected to the plurality of pixels to transmit a second scan signal; a plurality of initialization control lines connected to the plurality of pixels to transmit an initialization control signal; and a connection wire which connects at least one initialization control line among the plurality of initialization control lines and at least one second scan line among the plurality of second scan lines.

The plurality of pixels may be disposed in a matrix form along a row direction and a column direction, and the second scan line connected to the pixel of a first row of the matrix form may be connected to the initialization control line connected to the pixel of an n-th row of the matrix form.

The display device according to an exemplary embodiment may further include a scan driver which generates the first scan signal to be transmitted through the first scan line; and an initialization driving circuit which generates the initialization control signal to be transmitted through the initialization control line, and the initialization driving circuit may transmit the initialization control signal to the second scan line as the second scan signal, and the second scan signal applied to the second scan line connected to the pixel of the first row may have the same timing as the initialization control signal applied to the initialization control line connected to the pixel of the n-th row.

The second scan signal applied to the second scan line connected to the pixel of the first row may have the same timing as the initialization control signal applied to the initialization control line connected to the pixel of a ninth row of the matrix form.

The second scan line connected to the pixel of the first row may be connected to the second scan line connected to the pixel of a second row of the matrix form, and the initialization control line connected to the pixel of the first row may be connected to the initialization control line connected to the pixel of the second row.

The display device may further include a first region and a second region each including a plurality of pixels, where the number of pixels per unit area in the second region may be less than the number of pixels per unit area in the first region, and the number of second scan lines per unit area in the second region may be less than the number of second scan lines per unit area in the first region.

The number of second scan lines per unit area in the second region may be half of the number of second scan lines per unit area in the first region.

The number of initialization control lines per unit area in the second region may be less than the number of initialization control lines per unit area in the first region.

The plurality of pixels may be disposed in a matrix form along a row direction and a column direction, the pixels of two adjacent rows of the matrix form may be connected to the same initialization control line, and the pixels of two adjacent rows may be vertically symmetric with respect to the initialization control line.

A display device according to an exemplary embodiment includes a first region and a second region each including a plurality of pixels, and the number of pixels per unit area in the second region is less than the number of pixels per unit area in the first region, where each of the plurality of pixels includes a light emitting diode (LED) connected between a driving voltage line to which a driving voltage is applied and a common voltage line to which a common voltage is applied; a driving transistor connected between the driving voltage line and the light emitting diode (LED); a second transistor connected between a first electrode of the driving transistor and a data line to which a data voltage is applied, where the first electrode of the driving transistor is connected to the driving voltage line; and a storage capacitor connected between the driving voltage line and a gate electrode of the driving transistor, and a ratio of a width to a length of a channel of the driving transistor in the second region is different from a ratio of a width to a length of a channel of the driving transistor in the first region.

The ratio of the width to the length of the channel of the driving transistor in the second region may be larger than the ratio of the width to the length of the channel of the driving transistor in the first region.

The ratio of the width to the length of the channel of the driving transistor in the second region may be 155 percentages (%) or more and 206% or less of the ratio of the width to the length of the channel of the driving transistor in the first region.

The display device according to an exemplary embodiment may further include a substrate disposed in the first region and the second region; and a light blocking member disposed on the substrate, where the light blocking member may not be disposed in the first region.

The plurality of pixels may include a first pixel which represents a red color, a second pixel which represents a green color, and a third pixel which represents a blue color, a capacitance of the storage capacitor of the first pixel in the second region may be 86% or more and 140% or less of a capacitance of the storage capacitor of the first pixel in the first region, and a capacitance of the auxiliary capacitor of the first pixel in the second region may be 27% or more and 37% or less of the capacitance of the storage capacitor of the first pixel in the first region.

A capacitance of the storage capacitor of the second pixel in the second region may be 63% or more and 9 0% or less of a capacitance of the storage capacitor of the second pixel in the first region, and a capacitance of the auxiliary capacitor of the second pixel in the second region may be 27% or more and 33% or less of a capacitance of the storage capacitor of the second pixel in the first region.

A capacitance of the storage capacitor of the third pixel in the second region may be 81% or more and 137% or less of a capacitance of the storage capacitor of the third pixel in the first region, and a capacitance of the auxiliary capacitor of the third pixel in the second region may be 26% or more and 37% or less of a capacitance of the storage capacitor of the third pixel in the first region.

A display device according to an exemplary embodiment includes a first region and a second region each including a plurality of pixels; a substrate disposed in the first region and the second region; and a light blocking member disposed in the second region, where the number of pixels per unit area in the second region is smaller than the number of pixels per unit area in the first region, and each of the plurality of pixels includes a light emitting diode (LED) connected between a driving voltage line to which a driving voltage is applied and a common voltage line to which a common voltage is applied; a driving transistor connected between the driving voltage line and the light emitting diode (LED); a second transistor connected between a first electrode of the driving transistor and a data line to which a data voltage is applied, where the first electrode of the driving transistor is connected to the driving voltage line; and a storage capacitor connected between the driving voltage line and a gate electrode of the driving transistor, and the light blocking member is disposed between the substrate and the gate electrode of the driving transistor in the second region to form an auxiliary capacitor.

According to exemplary embodiments, a screen may be displayed in some regions of a display device in which parts such as a camera are disposed.

In addition, it is possible to increase the transmittance of the corresponding region so as to not affect the function of the component, or increase the luminance of the corresponding region so as to not be distinguished from other adjacent regions.

DETAILED DESCRIPTION

Figure 1:
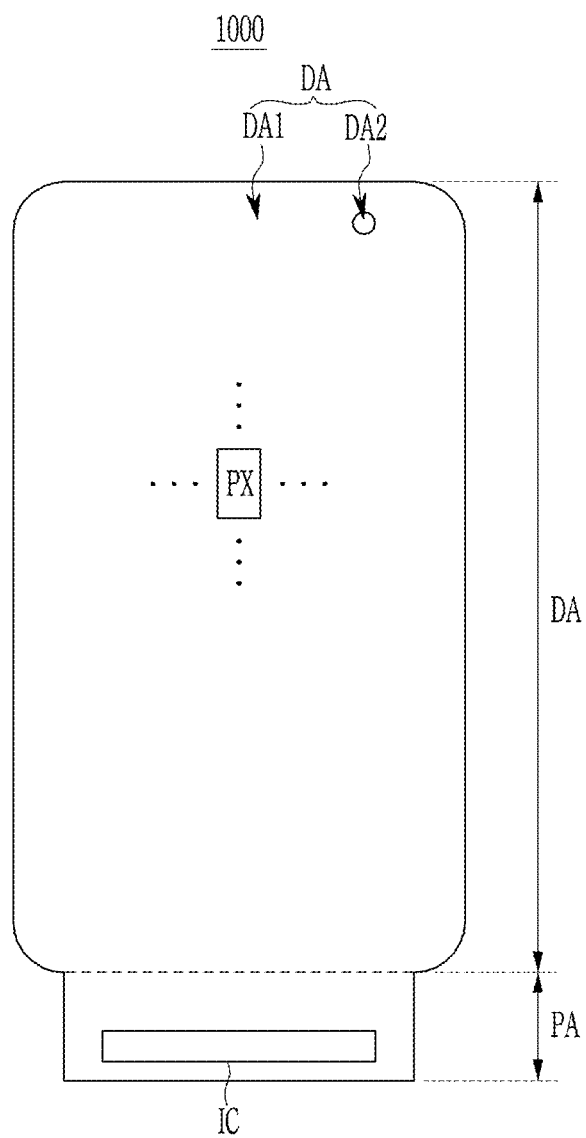
FIG. 1 is a top plan view schematically showing a display device according to an exemplary embodiment.

Hereinafter, the present invention will be described more fully with reference to the accompanying drawings, in which exemplary embodiments of the invention are shown. As those skilled in the art would realize, the described embodiments may be modified in various different ways, all without departing from the spirit or scope of the present invention.

Parts irrelevant to the description will be omitted to clearly describe the present invention, and the same elements will be designated by the same reference numerals throughout the specification.

Further, since sizes and thicknesses of constituent members shown in the accompanying drawings are arbitrarily given for better understanding and ease of description, the present invention is not limited thereto. In the drawings, the thickness of layers, films, panels, regions, etc., are exaggerated for clarity. In the drawings, for better understanding and ease of description, the thicknesses of some layers and areas are exaggerated.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, in the specification, the word "on" or "above" means positioned on or below the object portion, and does not necessarily mean positioned on the upper side of the object portion based on a gravitational direction.

In addition, unless explicitly described to the contrary, the word "comprise" and variations such as "comprises" or "comprising" will be understood to imply the inclusion of stated elements but not the exclusion of any other elements.

Further, in the specification, the phrase "in a plan view" means when an object portion is viewed from above, and the phrase "in a cross-section" means when a cross-section taken by vertically cutting an object portion is viewed from the side.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

First, a display device according to an exemplary embodiment is described with reference to FIG. 1.

FIG. 1 is a top plan view schematically showing a display device according to an exemplary embodiment.

As shown in FIG. 1, a display device 1000 according to an exemplary embodiment may include a display area DA in which an image is displayed and a peripheral area PA to which a driving circuit for driving the display area DA is mounted and in which no image is displayed.

The display area DA may have a substantial rectangle shape including relatively long sides and short sides, and a corner portion of the display area DA may have a shape having a curved surface that is chamfered. However, the shape of the display area DA is only an example and may be changed to various shapes. A plurality of pixels PX is disposed in the display area DA to display an image. In some regions of the edge of the display area DA, there may be a region where the pixels PX are not disposed and that does not display the image.

A plurality of pixels PX may be disposed in a matrix form along a row direction and a column direction, and may receive an image signal to accordingly display the image. However, the arrangement form of a plurality of pixels PX is not limited to this and may be variously changed in another exemplary embodiment. Although not shown, the display device 1000 may further include a plurality of wires. The wires may consist of a plurality of scan lines, a plurality of control lines, a plurality of data lines, a plurality of driving voltage lines, and the like. These wires may transmit scan signals, control signals, data signals, and driving voltages. A plurality of wires can be positioned to cross each other in a row direction or a column direction.

In addition, each pixel PX may include a plurality of transistors, a capacitor, and at least one light emitting diode (LED), which are connected to a plurality of wires. That is, the display device 1000 may be the organic light emitting device. However, the type of display device 1000 is not limited to this, and may be made of various types of display devices in another exemplary embodiment. For example, the display device 1000 may be a liquid crystal display device, an electrophoretic display device, or an electrowetting display device. In addition, the display device 1000 according to an exemplary embodiment may also be a next-generation display device such as a micro light emitting diode (LED) (Micro LED) display device, a quantum dot light emitting diode ("QLED") display device, and a quantum dot organic light emitting diode ("QD-OLED") display device.

The display area DA may include a first region DA1 and a second region DA2. The first region DA1 and the second region DA2 may respectively include a plurality of pixels PX. A density of the pixels PX disposed in the first region DA1 and a density of the pixels PX disposed in the second region DA2 may be different. As used herein, the density of the pixel PX means the number of pixels PX per unit area. That is, the number of pixels PX per unit area in the first region DA1 may be different from the number of pixels PX per unit area in the second region DA2. The number of pixels PX per unit area in the second region DA2 may be less than the number of pixels PX per unit area in the first region DA1. Also, the density of the wires disposed in the first region DA1 and the density of the wires disposed in the second region DA2 may be different. As used herein, the density of the wires means the number of wires per unit area. That is, the number of wires per unit area in the first region DA1 may be different from the number of wires per unit area in the second region DA2. The number of wires per unit area in the second region DA2 may be less than the number of wires per unit area in the first region DA1.

The second region DA2 may be surrounded by the first region DA1. The area of the first region DA1 may be relatively larger than the area of the second region DA2. The first region DA1 may mainly play a role of displaying the image emitted from the pixels PX therein, and the second region DA2 may have other functions together with the role of displaying the image. For example, a camera may be further disposed in the second region DA2. The camera may include a plurality of non-emissive elements, and these non-emissive elements may be disposed under the pixels PX. In the second region DA2, at least one of a proximity sensor, an illuminance sensor, a gesture sensor, a motion sensor, a fingerprint recognition sensor, a biometric sensor, and combinations thereof as well as the camera may be disposed. In addition, other parts with various functions may be disposed in the second region DA2. In FIG. 1, the display area DA is shown to include one second region DA2, but may also include a plurality of second regions DA2 in another exemplary embodiment.

The peripheral area PA may be disposed adjacent to one edge of the display area DA. For example, the peripheral area PA may be connected to the lower edge of the display area DA. However, the position of the peripheral area PA may be variously changed in another exemplary embodiment. For example, the peripheral area PA may be disposed at both edges of the display area DA. A driving circuit chip ("IC") may be disposed in the peripheral area PA. The driving circuit chip (IC) is connected with a plurality of pixels PX disposed in the display area DA through the wires, thereby transmitting various signals to a plurality of pixels PX. For example, the driving circuit chip (IC) may supply the scan signals, the control signals, the data signals, the driving voltages, and the like.

Although not shown, a flexible circuit board may be further disposed in the peripheral area PA. A circuit for controlling driving of the display device 1000 may be designed on the flexible circuit board and may be attached to the peripheral area PA.

Next, the first region DA1 of the display device according to an exemplary embodiment is described with reference to FIG. 2.

Figure 2:
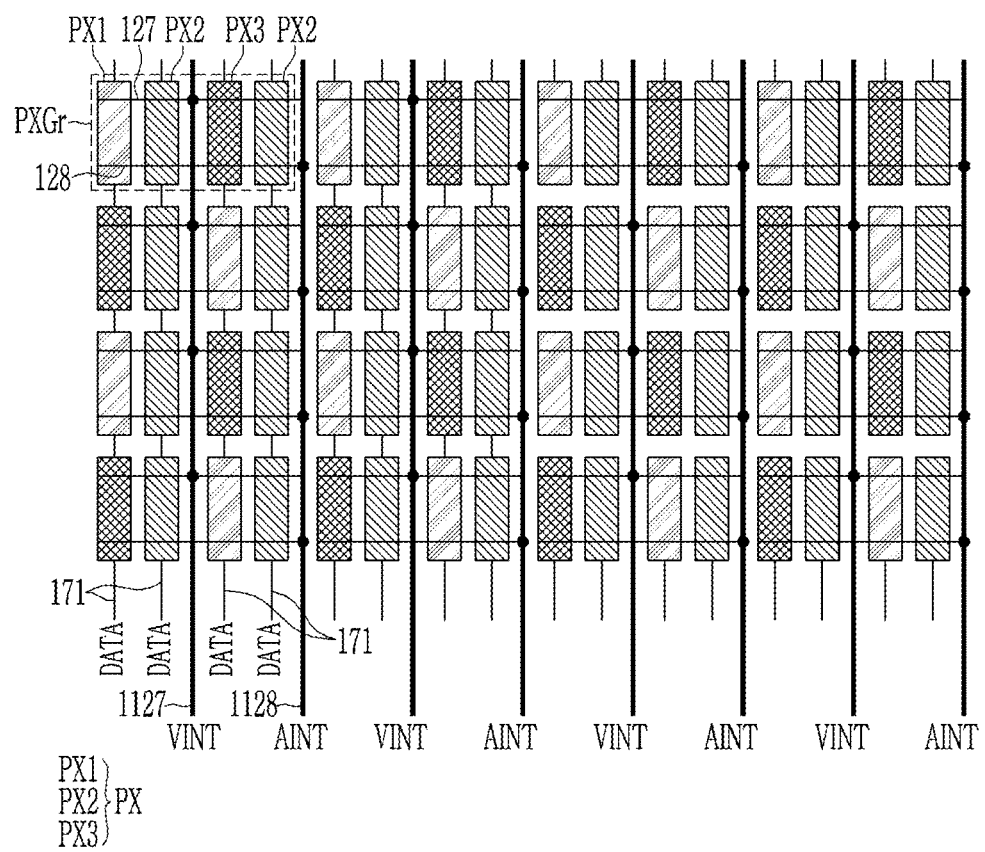
FIG. 2 is a top plan view showing some pixels disposed in a first region of a display device according to an exemplary embodiment.

FIG. 2 is a top plan view showing some pixels disposed in a first region DA1 of a display device according to an exemplary embodiment.

As shown in FIG. 2, in the first region DA1, a plurality of pixels PX and a plurality of wires 127, 128, 171, 1127, and 1128 connected to the plurality of pixels PX to transmit the signals may be disposed.

Some pixels PXs of the first region DA1 shown in FIG. 2 are disposed in a matrix form along four rows and sixteen columns, and the number of pixels PX and the number of rows and columns are only an example, and the invention is not limited thereto. The plurality of pixels PX may include a first pixel PX1 displaying a first color, a second pixel PX2 displaying a second color, and a third pixel PX3 displaying a third color. For example, the first color may display red, the second color may display green, and the third color may display blue. The color displayed by the plurality of pixels PX is not limited to this, and at least one of cyan, magenta, yellow, and a white-based color may be displayed in another exemplary embodiment. Here, one first pixel PX1, two second pixels PX2, and one third pixel PX3 may form one pixel group PXGr.

The plurality of wires may include a plurality of data lines 171 supplying a data signal DATA, a plurality of first initialization voltage lines 127 and a plurality of first initialization voltage supply lines 1127 supplying a first initialization voltage VINT, and a plurality of second initialization voltage lines 128 and a plurality of second initialization voltage supply lines 1128 supplying a second initialization voltage AINT.

The data line 171 is disposed for each pixel column and connected to each pixel PX in the pixel column. That is, the pixels PX disposed in the same column may be connected to the same data line 171 to receive the data signal DATA.

The first initialization voltage supply line 1127 may be disposed every four pixel columns. The first initialization voltage line 127 may connect the first initialization voltage supply line 1127 and each pixel PX. That is, the first initialization voltage VINT supplied by the first initialization voltage supply line 1127 may be transmitted to each pixel PX through the first initialization voltage line 127. For example, the first initialization voltage supply lines 1127 may disposed between the second pixel column and the third pixel column, between the sixth pixel column and the seventh pixel column, between the tenth pixel column and the eleventh pixel column, and between the fourteenth pixel column and the fifteenth pixel column, respectively. However, this is only an example, and the arrangement form of the first initialization voltage supply line 1127 may be variously changed in another exemplary embodiment. The plurality of first initialization voltage lines 127 is connected to first initialization voltage supply lines 1127, and the plurality of pixels PX is connected to the first initialization voltage lines 127.

The second initialization voltage supply line 1128 may be disposed every four pixel columns. The second initialization voltage line 128 may connect the second initialization voltage supply line 1128 and each pixel PX. That is, the second initialization voltage AINT supplied by the second initialization voltage supply line 1128 may be transmitted to each pixel PX through the second initialization voltage line 128. For example, the second initialization voltage supply lines 1128 may be disposed between the fourth pixel columns and the fifth pixel columns, between the eighth pixel columns and the ninth pixel columns, between the twelfth pixel columns and the thirteenth pixel columns, and between the sixteenth pixel columns and the seventeenth pixel columns, respectively. However, this is only an example, and the arrangement form of the second initialization voltage supply line 1128 may be variously changed in another exemplary embodiment. The plurality of second initialization voltage lines 128 is connected to second initialization voltage supply lines 1128, and the plurality of pixels PX is connected to second initialization voltage lines 128.

Hereinafter, the connection relationship of one pixel PX and each wire is described with reference to FIG. 3.

Figure 3:
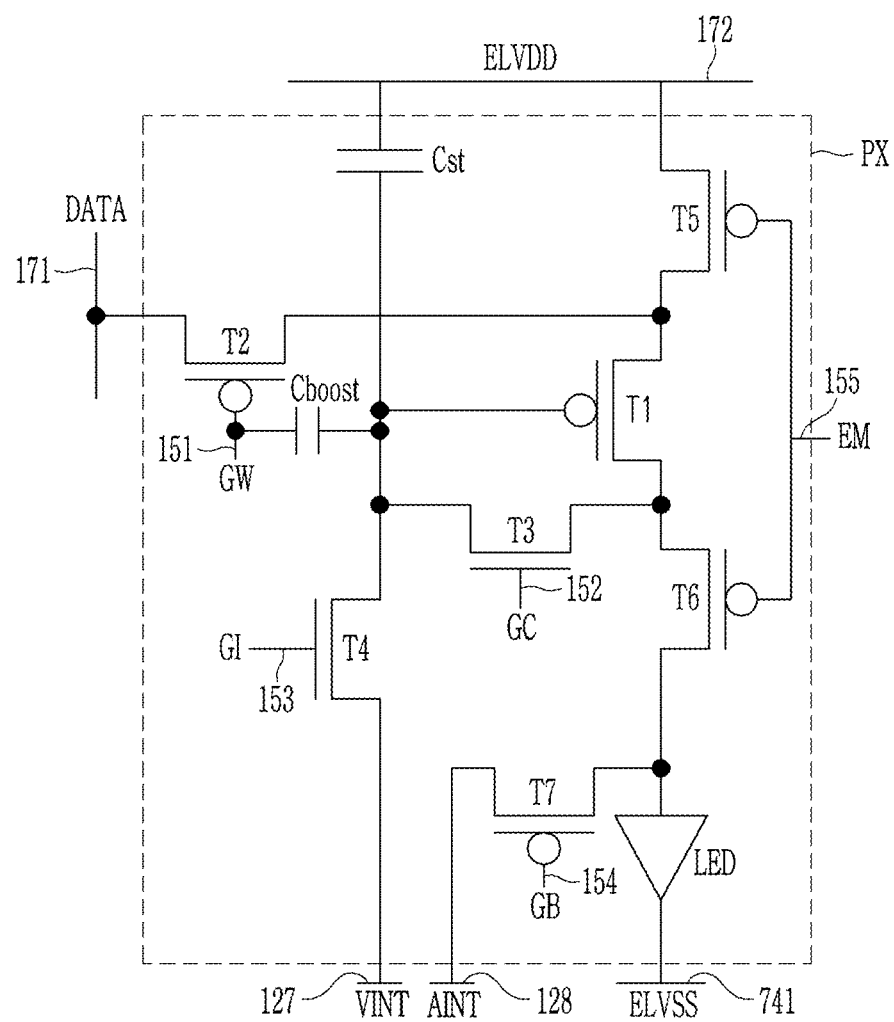
FIG. 3 is a circuit diagram of a display device according to an exemplary embodiment.

FIG. 3 is a circuit diagram of a display device according to an exemplary embodiment.

As shown in FIG. 3, one pixel PX of the display device according to an exemplary embodiment includes a plurality of transistors T1, T2, T3, T4, T5, T6, and T7, a storage capacitor Cst, a boost capacitor Cboost, and a light emitting diode LED, which are connected to several wires 127, 128, 151, 152, 153, 154, 155, 171, 172, and 741.

The plurality of wires 127, 128, 151, 152, 153, 154, 155, 171, 172, and 741 is connected to one pixel PX. The plurality of wires includes a first initialization voltage line 127, a second initialization voltage line 128, a first scan line 151, a second scan line 152, an initialization control line 153, a bypass control line 154, a light emission control line 155, a data line 171, a driving voltage line 172, and a common voltage line 741.

The first scan line 151 is connected to a gate driver (not shown) and transmits a first scan signal GW to the second transistor T2. The second scan line 152 may be applied with a voltage of an opposite polarity to the voltage applied to the first scan line 151 at the same time as the signal of the first scan line 151. For example, when a high voltage is applied to the first scan line 151, a low voltage may be applied to the second scan line 152. The second scan line 152 transfers the second scan signal GC to the third transistor T3.

The initialization control line 153 transmits the initialization control signal GI to the fourth transistor T4. The bypass control line 154 transmits the bypass signal GB to the seventh transistor T7. The bypass control line 154 may correspond to a first scan line 151 at the next stage. The light emission control line 155 transmits the light emission control signal EM to the fifth transistor T5 and the sixth transistor T6.

The data line 171 is a wire transmitting the data voltage DATA generated from a data driver (not shown), and a luminance emitted by the light emitting diode LED is changed according to the data voltage DATA applied to the pixel PX.

The driving voltage line 172 transmits the driving voltage ELVDD. The first initialization voltage line 127 transmits the first initialization voltage VINT, and the second initialization voltage line 128 transmits the second initialization voltage AINT. The common voltage line 741 applies the common voltage ELVSS to a cathode of the light emitting diode LED. In the present exemplary embodiment, the voltages applied to the driving voltage line 172, the first and second initialization voltage lines 127 and 128, and the common voltage line 741 may respectively be a constant voltage.

Next, a structure and a connection relationship of the plurality of transistors are described in detail.

The driving transistor T1 may have a p-type transistor characteristic, and may include a polycrystalline semiconductor. It is a transistor for adjusting a magnitude of the current output to the anode of the light emitting diode LED depending on the data voltage DATA applied to the gate electrode of the driving transistor T1. Since the brightness of the light emitting diode LED is adjusted according to the magnitude of the driving current output to the anode of the light emitting diode LED, the luminance of the light emitting diode LED may be adjusted according to the data voltage DATA applied to the pixel PX. For this purpose, the first electrode of the driving transistor T1 is disposed to receive the driving voltage ELVDD and is connected to the driving voltage line 172 through the fifth transistor T5. Also, the first electrode of the driving transistor T1 is connected to the second electrode of the second transistor T2, thereby also receiving the data voltage DATA. The second electrode of the driving transistor T1 is disposed to output the current toward the light emitting diode LED and is connected to the anode of the light emitting diode LED through the sixth transistor T6. In addition, the second electrode of the driving transistor T1 transmits the data voltage DATA applied to the first electrode to the third transistor T3. The gate electrode of the driving transistor T1 is connected with one electrode (hereinafter also referred to as a second storage electrode) of the storage capacitor Cst. Therefore, the voltage of the gate electrode of the driving transistor T1 changes according to the voltage stored in the storage capacitor Cst, and accordingly, the driving current output by the driving transistor T1 changes. In addition, the storage capacitor Cst also serves to maintain the voltage of the gate electrode of the driving transistor T1 to be constant for one frame.

The second transistor T2 may have the p-type transistor characteristic and may include the polycrystalline semiconductor. The second transistor T2 is a transistor receiving the data voltage DATA in the pixel PX. The gate electrode of the second transistor T2 is connected to the first scan line 151 and the first electrode of the boost capacitor Cboost. The first electrode of the second transistor T2 is connected to the data line 171. The second electrode of the second transistor T2 is connected to the first electrode of the driving transistor T1. If the second transistor T2 is turned on by the low voltage of the first scan signal GW transmitted through the first scan line 151, the data voltage DATA transmitted through the data line 171 is transmitted to the first electrode of the driving transistor T1.

The third transistor T3 may have an n-type transistor characteristic and may include an oxide semiconductor. The third transistor T3 electrically connects the second electrode of the driving transistor T1 and the gate electrode of the driving transistor T1. As a result, it is a transistor that transmits a compensation voltage of which the data voltage DATA is changed through the driving transistor T1 to the second storage electrode of the storage capacitor Cst. The gate electrode of the third transistor T3 is connected to the second scan line 152, and the first electrode of the third transistor T3 is connected to the second electrode of the driving transistor T1. The second electrode of the third transistor T3 is connected to the second storage electrode of the storage capacitor Cst, the gate electrode of the driving transistor T1, and the second electrode of the boost capacitor Cboost. The third transistor T3 is turned on by a high voltage of the second scan signal GC transmitted through the second scan line 152 to connect the gate electrode of the driving transistor T1 and the second electrode of the driving transistor T1 such that the voltage applied to the gate electrode of the driving transistor T1 is transmitted to the second storage electrode of the storage capacitor Cst to be stored to the storage capacitor Cst.

The fourth transistor T4 may have the n-type transistor characteristic, and may include the oxide semiconductor. The fourth transistor T4 serves to initialize the gate electrode of the driving transistor T1 and the second storage electrode of the storage capacitor Cst. The gate electrode of the fourth transistor T4 is connected to the initialization control line 153 and the first electrode of the fourth transistor T4 is connected to the first initialization voltage line 127. The second electrode of the fourth transistor T4 is connected to the second storage electrode of the storage capacitor Cst, the gate electrode of the driving transistor T1, and the second electrode of the boost capacitor Cboost via the second electrode of the third transistor T3. The fourth transistor T4 is turned on by the high voltage of the initialization control signal GI transmitted through the initialization control line 153, and in this case, the first initialization voltage VINT is transmitted to the gate electrode of the driving transistor T1 and the second storage electrode of the storage capacitor Cst. Accordingly, the voltages of the gate electrode of the driving transistor T1 and the storage capacitor Cst are initialized.

The fifth transistor T5 may have the p-type transistor characteristic and may include the polycrystalline semiconductor. The fifth transistor T5 serves to transmit the driving voltage ELVDD to the driving transistor T1. The gate electrode of the fifth transistor T5 is connected to the light emission control line 155, the first electrode of the fifth transistor T5 is connected to the driving voltage line 172, and the second electrode of the fifth transistor T5 is connected to the first electrode of the driving transistor T1.

The sixth transistor T6 may have the p-type transistor characteristic and may include the polycrystalline semiconductor. The sixth transistor T6 serves to transmit the driving current output from the driving transistor T1 to the light emitting diode LED. The gate electrode of the sixth transistor T6 is connected to the light emission control line 155, the first electrode of the sixth transistor T6 is connected to the second electrode of the driving transistor T1, and the second electrode of the sixth transistor T6 is connected to the anode of the light emitting diode LED.

The seventh transistor T7 may have the p-type transistor characteristic and may include the polycrystalline semiconductor. The seventh transistor T7 serves to initialize the anode of the light emitting diode LED. The gate electrode of the seventh transistor T7 is connected to the bypass control line 154, the first electrode of the seventh transistor T7 is connected to the anode of the light emitting diode LED, and the second electrode of the seventh transistor T7 is connected to the second initialization voltage line 128. If the seventh transistor T7 is turned on by the low voltage of the bypass signal GB, the second initialization voltage AINT is applied to the anode of the light emitting diode LED to be initialized.

Above, it is described that one pixel PX includes seven transistor (T1 to T7), one storage capacitor Cst, and one boost capacitor Cboost, however the invention is not limited thereto, and the number of transistors, the number of capacitors, and the connection relationship thereof may be variously changed in another exemplary embodiment.

In the present exemplary embodiment, the driving transistor T1 may include the polycrystalline semiconductor. Also, the third transistor T3 and the fourth transistor T4 may include the oxide semiconductor. The second transistor T2, the fifth transistor T5, the sixth transistor T6, and the seventh transistor T7 may include the polycrystalline semiconductor. However, the present invention is not limited thereto, and at least one of the second transistor T2, the fifth transistor T5, the sixth transistor T6, and the seventh transistor T7 may include the oxide semiconductor in another exemplary embodiment.

In the present exemplary embodiment, as the third transistor T3 and the fourth transistor T4 may include the different semiconductor material from the driving transistor T1, the driving may be performed more stably, and the reliability may be improved. However, the present invention is not limited to this, and all transistors included in one pixel may include the polycrystalline semiconductor in another exemplary embodiment. In addition, on the contrary, all transistors included in one pixel may include the oxide semiconductor in still another exemplary embodiment.

As described above, when the high voltage is applied to the first scan line 151, the low voltage is applied to the second scan line 152, and when the low voltage is applied to the first scan line 151, the high voltage is applied to the second scan line 152 at the same time. That is, since the second scan signal GC applied to the second scan line 152 is the signal inverted to the first scan signal GW applied to the first scan line 151, the gate voltage of the driving transistor T1 is lowered after data is written. Conversely, the first scan signal GW increases the gate voltage of the driving transistor T1. Therefore, when writing a black voltage, the black voltage may decrease. In the present exemplary embodiment, as the boost capacitor Cboost is disposed between the first scan line 151 to which the first scan signal GW is applied and the gate electrode of the driving transistor T1, the gate voltage of the driving transistor T1 increases such that the black voltage may be stably output. As the capacity of the boost capacitor Cboost increases, the gate voltage of the driving transistor T1 may increase. By adjusting the capacity of the boost capacitor Cboost, the gate voltage of the driving transistor T1 may be controlled.

Next, the second region DA2 of the display device 1000 according to an exemplary embodiment is described with reference to FIG. 4.

Figure 4:
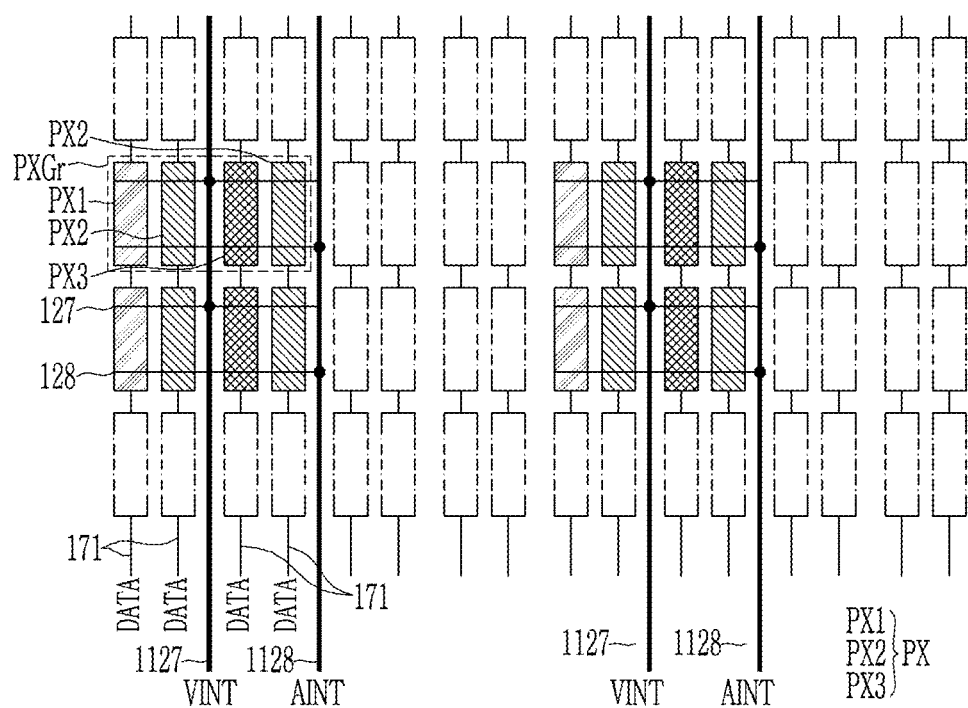
FIG. 4 is a top plan view showing some pixels disposed in a second region of a display device according to an exemplary embodiment.

FIG. 4 is a top plan view showing some pixels disposed in a second region DA2 of a display device 1000 according to an exemplary embodiment.

As shown in FIG. 4, in the second region DA2, a plurality of pixels PX and a plurality of wires 127, 128, 171, 1127, and 1128 connected to the plurality of pixels PX to transmit the signals may be disposed.

Some pixels PX of the second region DA2 shown in FIG. 4 are disposed along two rows and eight columns, and the number of pixels PX and the number of rows and columns are only examples, and the invention are not limited thereto. For comparison with the arrangement form of pixels PX in the first region DA1, a dotted line corresponding to the pixel PX represents the region where the pixel PX is not actually disposed in the second region DA2. The plurality of pixels PX may include first pixels PX1, second pixels PX2, and third pixels PX3. Four pixels PX (e.g., one first pixel PX1, two second pixels PX2, and one third pixel PX3) may form one pixel group PXGr. Two pixel groups PXGr may be positioned adjacent to each other, and another two pixel groups PXGr may be disposed to be spaced apart from the two pixel groups PXGr. That is, two pixel groups PXGr may be surrounded by a region where the pixels PX are not disposed. However, the arrangement form of the pixels PX in the second region DA2 may be variously changed in another exemplary embodiment.

In the same area, the first region DA1 may include the sixteen pixel groups PXGr, and the second region DA2 may include four pixel groups PXGr. Accordingly, in the same area, the first region DA1 may include sixty-four pixels PX, and the second region DA2 may include sixteen pixels PX. That is, the number of pixels PX per unit area in the second region DA2 is less than the number of pixels PX per unit area in the first region DA1. In this case, the number of pixels PX per unit area in the second region DA2 may be about one sixth or more and about half or less of the number of pixels PX per unit area in the first region DA1. For example, the number of pixels PX per unit area in the second region DA2 may be about one quarter of the number of pixels PX per unit area in the first region DA1. As described above, by reducing the number of pixels PX disposed in the second region DA2, transmittance of the second region DA2 may increase compared to the first region DA1. Therefore, the influence applied to other parts disposed in the second region DA2 by the pixels PX may be reduced.

The plurality of wires may include a plurality of data lines 171, a plurality of first initialization voltage lines 127, a plurality of first initialization voltage supply lines 1127, a plurality of second initialization voltage lines 128, and a plurality of second initialization voltage supply lines 1128.

The data line 171 is disposed for each pixel column and is connected to each pixel PX in the pixel column. The data line 171 may be disposed even where the pixel PX is not disposed. In the same area, the first region DA1 may include the sixteen data lines 171, and the second region DA2 may also include the sixteen data lines 171. That is, the number of data lines 171 per unit area in the second region DA2 may be substantially the same as the number of data lines 171 per unit area in the first region DA1.

The first initialization voltage supply line 1127 may be disposed every eight pixel columns. The first initialization voltage line 127 may connect the first initialization voltage supply line 1127 and each pixel PX. That is, the first initialization voltage VINT supplied by the first initialization voltage supply line 1127 may be transmitted to each pixel PX through the first initialization voltage line 127. For example, the first initialization voltage supply line 1127 may be disposed between the second pixel column and the third pixel column, and between the tenth pixel column and the eleventh pixel column. However, this is only an example, and the arrangement form of the first initialization voltage supply line 1127 can be variously changed in another exemplary embodiment. The plurality of first initialization voltage lines 127 is connected to the first initialization voltage supply lines 1127, and the plurality of pixels PX is connected to first initialization voltage lines 127.

Within the same area, four first initialization voltage supply lines 1127 may be disposed in the first region DA1, and two first initialization voltage supply lines 1127 may be disposed in the second region DA2. That is, the number of first initialization voltage supply lines 1127 per unit area in the second region DA2 is less than the number of first initialization voltage supply lines 1127 per unit area in the first region DA1. In this case, the number of first initialization voltage supply lines 1127 per unit area in the second region DA2 may be about one sixth or more and less than about 1 times the number of first initialization voltage supply lines 1127 per unit area in the first region DA1. For example, the number of first initialization voltage supply lines 1127 per unit area in the second region DA2 may be about half of the number of first initialization voltage supply lines 1127 per unit area in first region DA1.

Also, within the same area, the sixteen first initialization voltage lines 127 may be disposed in the first region DA1, and the four first initialization voltage lines 127 may be disposed in the second region DA2. That is, the number of first initialization voltage lines 127 per unit area in the second region DA2 is less than the number of first initialization voltage lines 127 per unit area in the first region DA1. For example, the number of first initialization voltage line 127 per unit area in the second region DA2 may be about one quarter of the number of first initialization voltage line 127 per unit area in the first region DA1.

The second initialization voltage supply line 1128 may be disposed every eight pixel columns. The second initialization voltage line 128 may connect the second initialization voltage supply line 1128 and each pixel PX. That is, the second initialization voltage AINT supplied by the second initialization voltage supply line 1128 may be transmitted to each pixel PX through the second initialization voltage line 128. For example, the second initialization voltage supply lines 1128 may be disposed between the fourth pixel column and the fifth pixel column, and between the twelfth pixel column and the thirteen pixel column, respectively. However, this is only an example, and the arrangement form of the second initialization voltage supply lines 1128 may be variously changed in another exemplary embodiment. The plurality of second initialization voltage lines 128 is connected to second initialization voltage supply lines 1128, and the plurality of pixels PX is connected to the second initialization voltage line 128.

Within the same area, four second initialization voltage supply lines 1128 may be disposed in the first region DA1, and two second initialization voltage supply lines 1128 may be disposed in the second region DA2. That is, the number of second initialization voltage supply lines 1128 per unit area in DA2 in the second region is less than the number of second initialization voltage supply lines 1128 per unit area in first region DA1. In this case, the number of second initialization voltage supply lines 1128 per unit area in the second region DA2 may be about one sixth or more and less than about 1 times the number of second initialization voltage supply lines 1128 per unit area in the first region DA1. For example, the number of second initialization voltage supply lines 1128 per unit area in the second region DA2 may be about half of the number of second initialization voltage supply lines 1128 per unit area in the first region DA1.

Also, within the same area, the sixteen second initialization voltage lines 128 may be disposed in the first region DA1 and the four second initialization voltage lines 128 may be disposed in the second region DA2. That is, the number of second initialization voltage lines 128 per unit area in the second region DA2 is less than the number of second initialization voltage lines 128 per unit area in the first region DA1. For example, the number of second initialization voltage lines 128 per unit area in the second region DA2 may be about one quarter of the number of second initialization voltage line 128 per unit area in the first region DA1.

That is, the number of wires per unit area in the second region DA2 is less than the number of wires per unit area in the first region DA1. The sum of the number of first initialization voltage supply lines 1127 and the number of second initialization voltage supply lines 1128 per unit area in the second region DA2 may be about one sixth or more and less than about 1 times the sum of the number of first initialization voltage supply lines 1127 and the number of second initialization voltage supply lines 1128 per unit area in the first region DA1. For example, the sum of the number of first initialization voltage supply lines 1127 and the number of second initialization voltage supply lines 1128 per unit area in the second region DA2 may be about half of the sum of the number of first initialization voltage supply lines 1127 and second initialization voltage supply lines 1128 per unit area in the first region DA1. As described above, by reducing the number of wires disposed in the second region DA2, the transmittance of the second region DA2 may increase compared to the first region DA1. Therefore, the influence applied to other parts disposed in the second region DA2 by the pixel PX may be reduced.

Next, the display device according to an exemplary embodiment is described with reference to FIG. 5 and FIG. 6.

Figure 5:
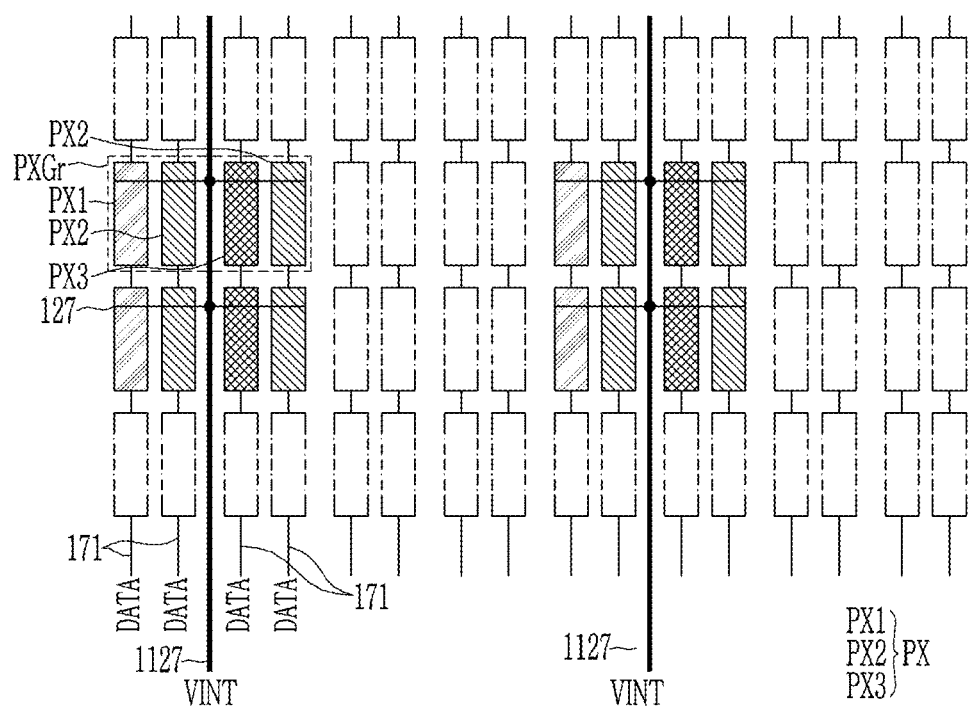
FIG. 5 is a top plan view showing some pixels disposed in a second region of a display device according to an exemplary embodiment.
Figure 6:
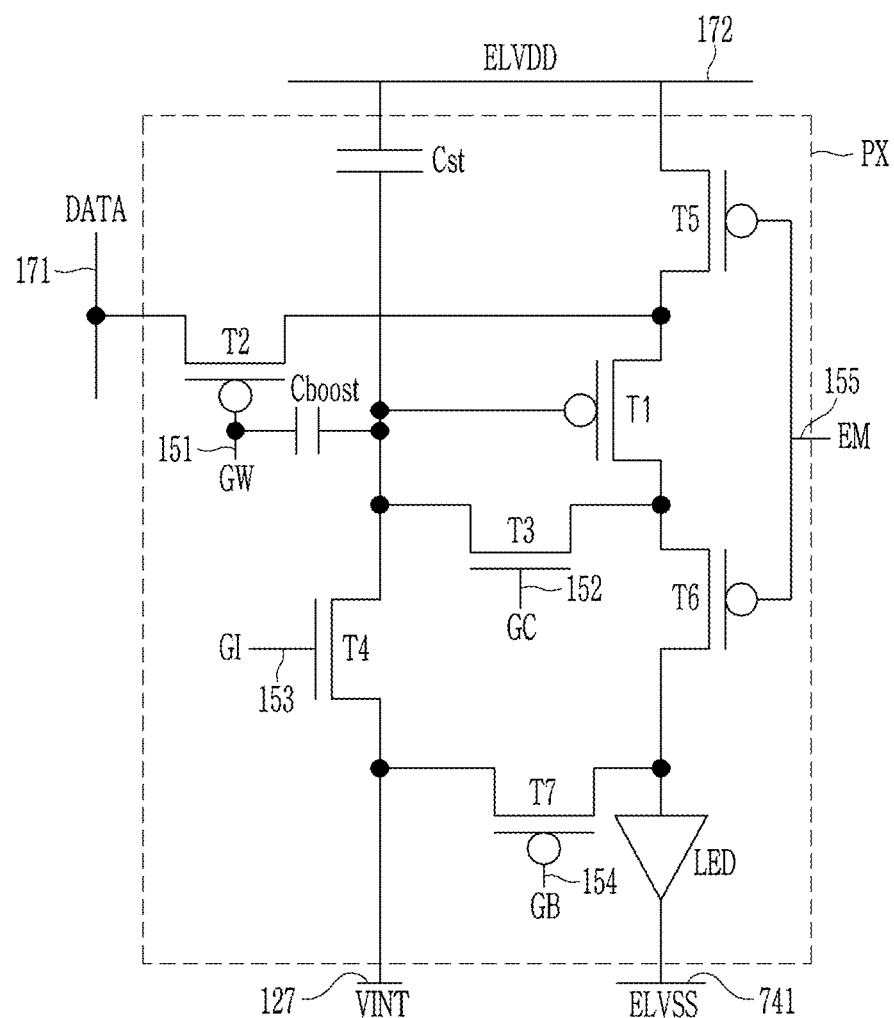
FIG. 6 is a circuit diagram of a pixel disposed in a second region of a display device according to an exemplary embodiment.

Since the display device according to the exemplary embodiment shown in FIG. 5 and FIG. 6 has many same portions as the display device according to the exemplary embodiment shown in FIG. 1 to FIG. 4, the description of the same portions is omitted. The present exemplary embodiment is different from the previous exemplary embodiments regarding FIGS. 1 to FIG. 4 on the point that the second initialization voltage line 128 and the second initialization voltage supply line 1128 are not disposed in the second region DA2, and this is further described.

FIG. 5 is a top plan view showing some pixels disposed in a second region of a display device according to an exemplary embodiment, and FIG. 6 is a circuit diagram of a pixel disposed in a second region of the display device according to an exemplary embodiment.

As shown in FIG. 5, in the second region DA2, a plurality of pixels PX and a plurality of wires 127, 171, and 1127 connected to the plurality of pixels PX to transmit the signals may be disposed.

In the present exemplary embodiment, the arrangement form of the pixels PX of the first region DA1 and the second region DA2 may be substantially the same as the arrangement form of the pixels PX of the first region DA1 and the second region DA2 in the previous exemplary embodiment. Therefore, the number of pixels PX per unit area in the second region DA2 is less than the number of pixels PX per unit area in the first region DA1. For example, the number of pixels PX per unit area in the second region DA2 may be about one quarter of the number of pixels PX per unit area in the first region DA1.

The plurality of wires may include a plurality of data lines 171, a plurality of first initialization voltage lines 127, and a plurality of first initialization voltage supply lines 1127. In the previous exemplary embodiment, the plurality of second initialization voltage lines 128 and the plurality of second initialization voltage supply lines 1128 are disposed in the first region DA1 and the second region DA2. However, in the present exemplary embodiment, the second initialization voltage lines 128 and the second initialization voltage supply lines 1128 are not disposed in the second region DA2. That is, in the present exemplary embodiment, the second initialization voltage lines 128 and the second initialization voltage supply lines 1128 are positioned in the first region DA1 and not in the second region DA2.

The number of wires per unit area in the second region DA2 is less than the number of wires per unit area in the first region DA1. The number of first initialization voltage supply lines 1127 per unit area in the second region DA2 may be about one sixth or more and less than 1 times the sum of the number of first initialization voltage supply lines 1127 and second initialization voltage supply lines 1128 per unit area in the first region DA1, For example, the number of first initialization voltage supply lines 1127 per unit area in the second region DA2 may be about one quarter of the sum of the number of first initialization voltage supply lines 1127 and the second initialization voltage supply lines 1128 per unit area in the first region DA1. As described above, by further reducing the number of wires disposed in the second region DA2, the transmittance of the second region DA2 may further increase compared to the first region DA1. Therefore, the influence applied to other parts disposed in the second region DA2 by the pixels PX may be reduced.

Since the second initialization voltage lines 128 and the second initialization voltage supply lines 1128 are not disposed in the second region DA2, the circuit of the pixel PX disposed in the second region DA2 may be different from the circuit of the pixel PX positioned in the first region DA1. Next, the connection relationship of one pixel PX and each wire disposed in the second region DA2 is described with reference to FIG. 6.

As shown in FIG. 6, one pixel PX of the display device according to an exemplary embodiment includes a plurality of transistors T1, T2, T3, T4, T5, T6, and T7, a storage capacitor Cst, a boost capacitor Cboost, and a light emitting diode LED, which are connected to the several wires 127, 151, 152, 153, 154, 155, 171, 172, and 741.

The plurality of wires 127, 151, 152, 153, 154, 155, 171, 172, and 741 are connected to one pixel PX. The plurality of wires includes a first initialization voltage line 127, a first scan line 151, a second scan line 152, an initialization control line 153, a bypass control line 154, a light emission control line 155, a data line 171, a driving voltage line 172, and a common voltage line 741.

The pixel PX disposed in the first region DA1 is connected to the second initialization voltage line 128, but the pixel PX disposed in the second region DA2 is not connected to the second initialization voltage line 128. Therefore, the seventh transistor T7 of the pixel PX disposed in the first region DA1 is connected to the second initialization voltage line 128, but the seventh transistor T7 of the pixel PX disposed in the second region DA2 is not connected to the second initialization voltage line 128. The second electrode of the seventh transistor T7 of the pixel PX disposed in the second region DA2 may be connected to the first initialization voltage line 127. If the seventh transistor T7 is turned on by the low voltage of the bypass signal GB, the first initialization voltage VINT is applied to the anode of the light emitting diode LED to be initialized.

Next, the display device according to an exemplary embodiment is described with reference to FIG. 7 to FIG. 9.

Figure 7:
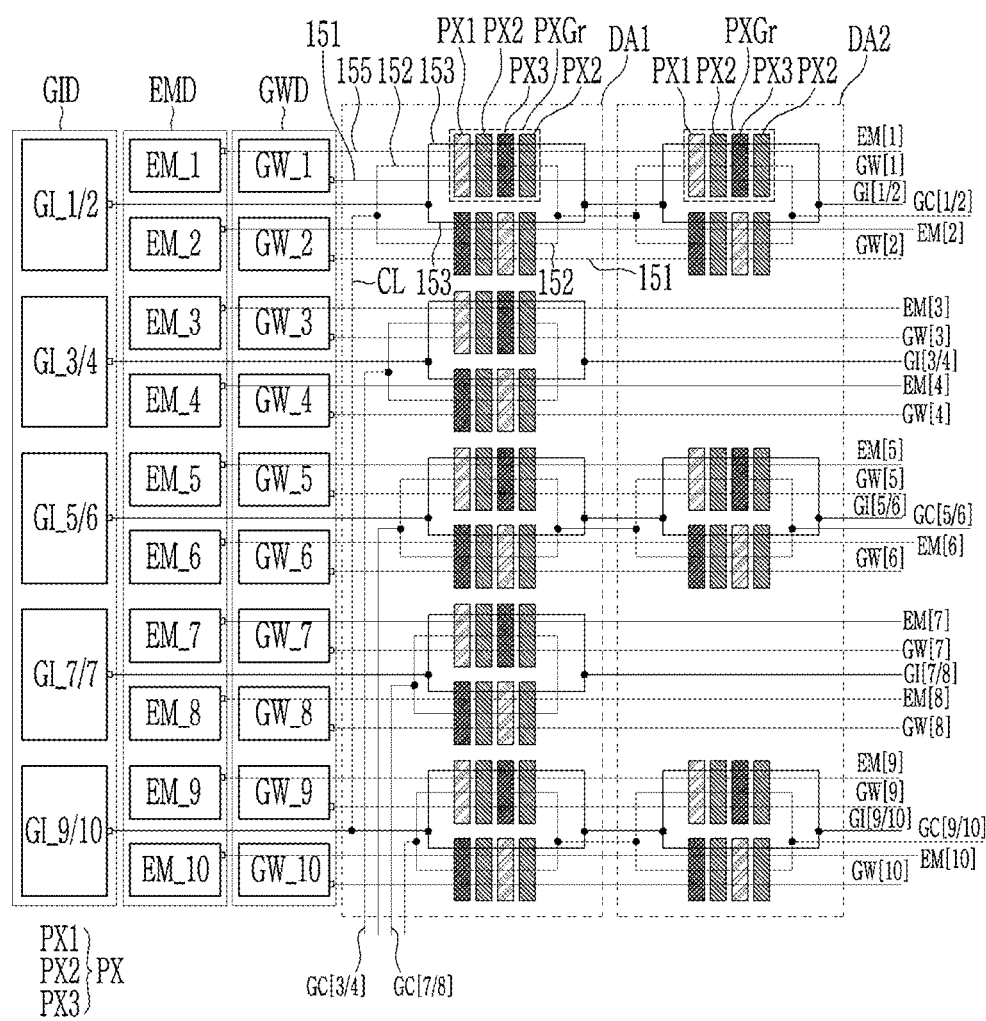
FIG. 7 is a view showing a connection relationship of some pixels and wires of a display device according to an exemplary embodiment.
Figure 8:
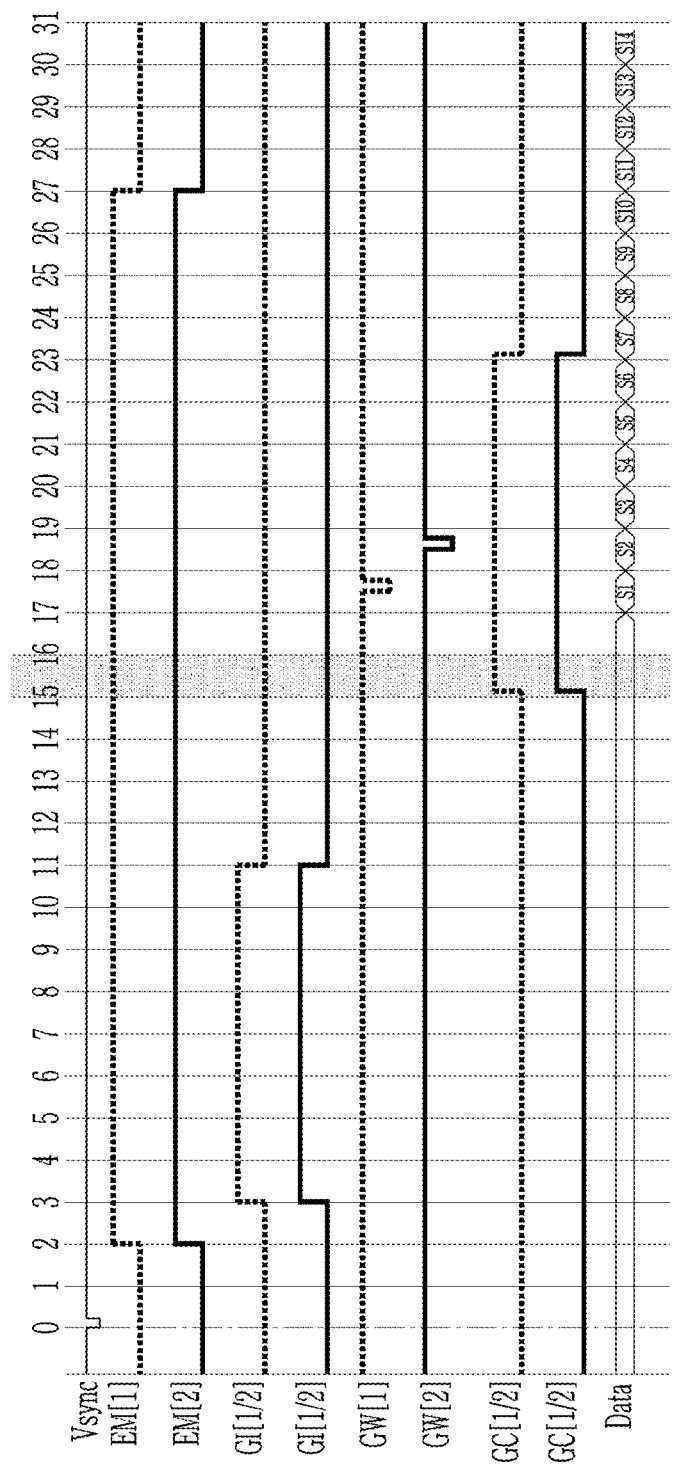
FIG. 8 is a signal timing diagram showing a plurality of signals applied to two adjacent pixel rows of a display device according to an exemplary embodiment.
Figure 9:
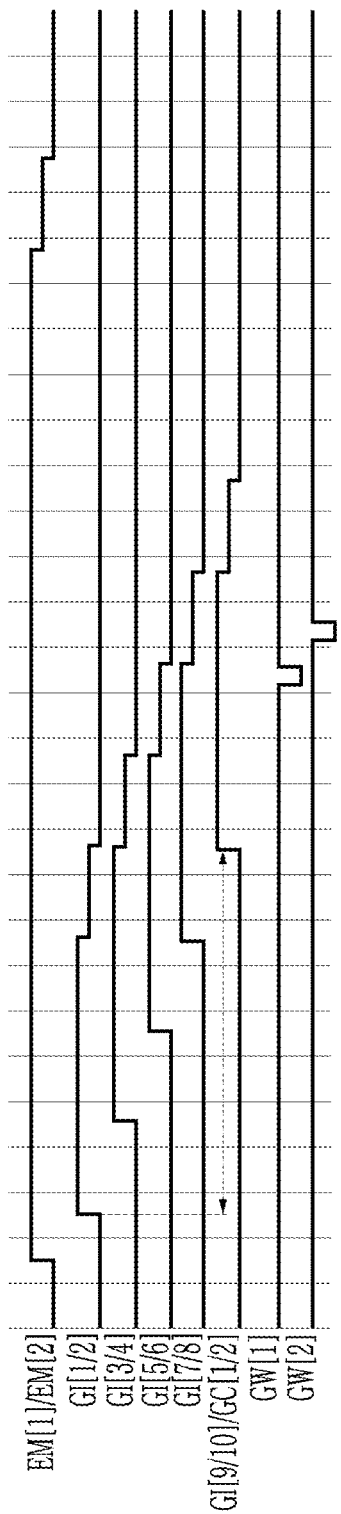
FIG. 9 is a signal timing diagram showing a relationship of signals applied to some pixels of a display device according to an exemplary embodiment.

The display device according to the exemplary embodiment shown in FIG. 7 to FIG. 9 is the same as most of the display device according to the exemplary embodiment shown in FIG. 1 to FIG. 6 such that the description for the same parts is omitted. The present exemplary embodiment is different from the previous exemplary embodiment on the point that the initialization control line may be connected to the second scan line, and this is described further.

First, the connection of the pixel and the wires of the display device according to an exemplary embodiment is described with reference to FIG. 7.

FIG. 7 is a view showing a connection relationship of some pixels and wires of a display device according to an exemplary embodiment.

As shown in FIG. 7, the display device according to an exemplary embodiment includes a plurality of pixels PX and a plurality of wires 151, 152, 153, and 155 connected to the plurality of pixels PX to transmit the signals. FIG. 7 only shows some wires among the plurality of wires connected to each pixel PX, and the connection relationship of one pixel PX and each wire of the display device according to the present exemplary embodiment may have the shape of the circuit diagram shown in FIG. 3 or FIG. 6.

The display area DA may include a first region DA1 and a second region DA2. The first region DA1 and the second region DA2 may each include a plurality of pixels PX. A plurality of pixels PX may include a first pixel PX1, a second pixel PX2, and a third pixel PX3, and four pixels PX (e.g., one first pixel PX1, two second pixels PX2, and one third pixel PX3) may form one pixel group PXGr.

In the present exemplary embodiment, the arrangement form of the pixel PX of the first region DA1 and the second region DA2 may be substantially the same as the arrangement form of the pixels PX of the first region DA1 and the second region DA2 in the previous exemplary embodiment. Therefore, the number of pixels PX per unit area in the second region DA2 is less than the number of pixels PX per unit area in the first region DA1. FIG. 7 shows some pixel columns disposed in the first region DA1 and some pixel columns disposed in the second region DA2 side by side. The pixel PX may not be disposed in the second region DA2 corresponding to the third and fourth pixel rows of the first region DA1, and the pixel PX may not be disposed in the second region DA2 corresponding to the seventh and eighth pixel rows of the first region DA1.

The plurality of wires may include a first scan line 151, a second scan line 152, an initialization control line 153, and a light emission control line 155.

The first scan line 151 is disposed for each pixel row and connected to each pixel PX in the pixel row. That is, the pixels PX disposed in the same row are connected to the same first scan line 151 to receive first scan signals GW[1] to GW[10]. The display device according to an exemplary embodiment may further include a scan driver GWD generating the first scan signals GW[1] to GW[10] to be transmitted through the first scan line 151. The scan driver GWD may include a plurality of stages GW_1 to GW_10. Each of the stages GW_1 to GW_10 of the scan driver GWD may correspond to each pixel row. Each of the stages GW_1 to GW_10 of the scan driver GWD is connected to each pixel PX through the first scan line 151, thereby transmitting the first scan signals GW[1] to GW[10] to each pixel PX. The first scan signals GW[1] to GW[10] may be sequentially applied to each pixel row.

The light emission control line 155 is disposed for each pixel row and connected to each pixel PX. That is, the pixels PX disposed in the same row are connected to the same light emission control line 155 to receive the light emission control signals EM[1] to EM[10]. The display device according to an exemplary embodiment may further include a light emission driver EMD generating the light emission control signals EM[1] to EM[10] to be transmitted through the light emission control line 155. The light emission driver EMD may include a plurality of stage EM_1 to EM_10. Each of the stages EM_1 to EM_10 of the light emission driver EMD may correspond to each pixel row. Each of the stages EM_1 to EM_10 of the light emission driver EMD may be connected to each pixel PX of the light emission control line 155 to transmit the light emission control signals EM[1] to EM[10] to each pixel PX.

The initialization control line 153 is connected to each pixel PX. The pixels PX disposed in the same row may be connected to the same initialization control line 153 and transmit the initialization control signal GI[1/2] to GI[9/10]. The same initialization control signal GI [1/2] to GI [9/10] may be applied to adjacent two pixel rows. Therefore, the initialization control line 153 connected to the pixel PX of the first row may be connected to the initialization control line 153 connected to the pixel PX of the second row. Similarly, the initialization control lines 153 connected to the pixels PX of the third row and fourth row may be connected to each other, and the initialization control lines 153 connected to the pixels PX of the fifth row and sixth row may be connected to each other. In the case of the third row and the fourth row, the pixel PX is disposed in the first region DA1, however, the pixel PX is not disposed in the second region DA2. Therefore, in the second region DA2, a single initialization control line 153 may pass between the third row and the fourth row.

The display device according to an exemplary embodiment may further include an initialization driving circuit GID generating initialization control signals GI[1/2] to GI[9/10] to be transmitted through the initialization control line 153. The initialization driving circuit GID may include a plurality of stages GI_1/2 to GI_9/10. Each of the stages GI_1/2 to GI_9/10 of the initialization driving circuit GID may correspond to every two pixel rows. Each of the stages GI_1/2 to GI_9/10 of the initialization driving circuit GID is connected to each pixel PX of the initialization control line 153, thereby transmitting the initialization controls signals GI[1/2] to GI[9/10] to each pixel PX.

The second scan line 152 is connected to each pixel PX. The pixels PX disposed in the same row are connected to the same second scan line 152, thereby receiving the second scan signals GC[1/2] to GC[9/10] through the second scan line 152. In this case, the same second scan signals GC[1/2] to GC[9/10] may be applied to two adjacent pixel rows. Therefore, the second scan line 152 connected with the pixel PX of the first row may be connected to the second scan line 152 connected with the pixel PX of the second row. Likewise, the second scan lines 152 connected to the pixels PX of the third row and the fourth row may be connected to each other. The second scan lines 152 connected to the pixels PX of the fifth row and the sixth row may be connected to each other. In the case of the third row and the fourth row, the pixel PX is disposed in the first region DA1, but the pixel PX is not disposed in the second region DA2. In this case, the second scan line 152 is not disposed in the portion of the second region DA2 corresponding to the third row and the fourth row. Therefore, the number of second scan lines 152 per unit area in the second region DA2 is less than the number of second scan lines 152 per unit area in the first region DA1. For example, the number of second scan lines 152 per unit area in second region DA2 may be about half of the number of second scan lines 152 per unit area in the first region DA1. As described above, by reducing the number of wires disposed in the second region DA2, the transmittance of the second region DA2 may be increased compared to the first region DA1. Therefore, the influence on other parts disposed in the second region DA2 by the pixel PX may be reduced.

The display device according to the present exemplary embodiment does not include a separate driving unit for generating the second scan signals GC [1/2] to GC [9/10]. Instead, the display device according to an exemplary embodiment may include a connection wire CL connecting at least one of a plurality of initialization control lines 153 and at least one of a plurality of second scan lines 152. For example, the connection wire CL may connect the second scan line 152 connected to the pixel PX of the first row among the plurality of second scan lines 152 and the initialization control line 153 connected to the pixel PX of the ninth row among the plurality of initialization control lines 153. This is only an example, and the second scan line 152 connected to the pixel PX of the first row may be connected to the initialization control line 153 connected with the pixel PX of a row other than the ninth row in another exemplary embodiment. That is, the second scan line 152 connected to the pixel PX of the first row among the plurality of second scan lines 152 may be connected to the initialization control line 153 connected to the pixel PX of an n-th row among the plurality of initialization control lines 153, and an n value may be variously set. The second scan signal GC[1/2] applied to the second scan line 152 connected to the pixel PX of the first row by this connection wire CL may have the same timing as the initialization control signal GI[9/10] applied to the control line 153 connected to the pixel PX of the ninth row. That is, the second scan signal GC[1/2] applied to the second scan line 152 connected to the pixel PX of the first row may have the same timing as the initialization control signal applied to the initialization control line 153 connected to the pixel PX of the n-th row, and the n value may be variously set. Therefore, the initialization driving circuit GID may transmit the initialization control signals GI[1/2] to GI[9/10] as the second scan signals GC[1/2] to GC[9/10] to the second scan line 152.

Next, the signal applied to each wire is described with referee to FIG. 8 and FIG. 9.

FIG. 8 is a signal timing diagram showing a plurality of signals applied to two adjacent pixel rows of a display device according to an exemplary embodiment, and FIG. 9 is a signal timing diagram showing a relationship of signals applied to some pixel of a display device according to an exemplary embodiment.

As shown in FIG. 8 and FIG. 9, after the light emission control signals EM[1] and EM[2] of a high voltage are applied to the pixels PX of the first row and the second row, the initialization control signal GI[1/2] of a high voltage may be applied to the pixels PX of the first row and the second row. Next, the initialization control signal GI[1/2] may be changed into a low voltage, and the first scan signals GW[1] and GW[2] of a low voltage may be sequentially applied to the pixels PX of the first row and the second row. Also, the second scan signal GC[1/2] of a high voltage may be applied to the pixels PX of the first row and the second row. At this time, the time at which the initialization control signal GI[1/2] is maintained with a high voltage and the time at which the second scan signal GC[1/2] is maintained with a high voltage are similar, but there is a difference in the timing at which the signals are applied. That is, when the initialization control signal GI[1/2] has been shifted for a predetermined time, the second scan signal GC[1/2] may be obtained. The initialization control signal GI[1/2] applied to the pixels PX of the third row and the fourth row may have a shifted value of the initialization control signal GI[1/2] applied to the pixel PX of the first row and the second row. The second scan signal GC[1/2] applied to the second scan line 152 connected to the pixel PXs of the first row and the second row may have substantially the same timing as the initialization control signal GI[9/10] applied to the initialization control line 153 connected to the pixel PX of the ninth row and the tenth row. However, this is only one example, and according to a design of each pixel PX, the second scan signal GC[1/2] applied to the second scan line 152 connected to the pixel PX of the first row and the second row may have substantially the same timing as the initialization control signal GI[9/10] applied to the initialization control line 153 connected to the pixel PX of the 1first row and twelfth row.

Next, the display device 1000 according to another exemplary embodiment is described with reference to FIG. 10.

Figure 10:
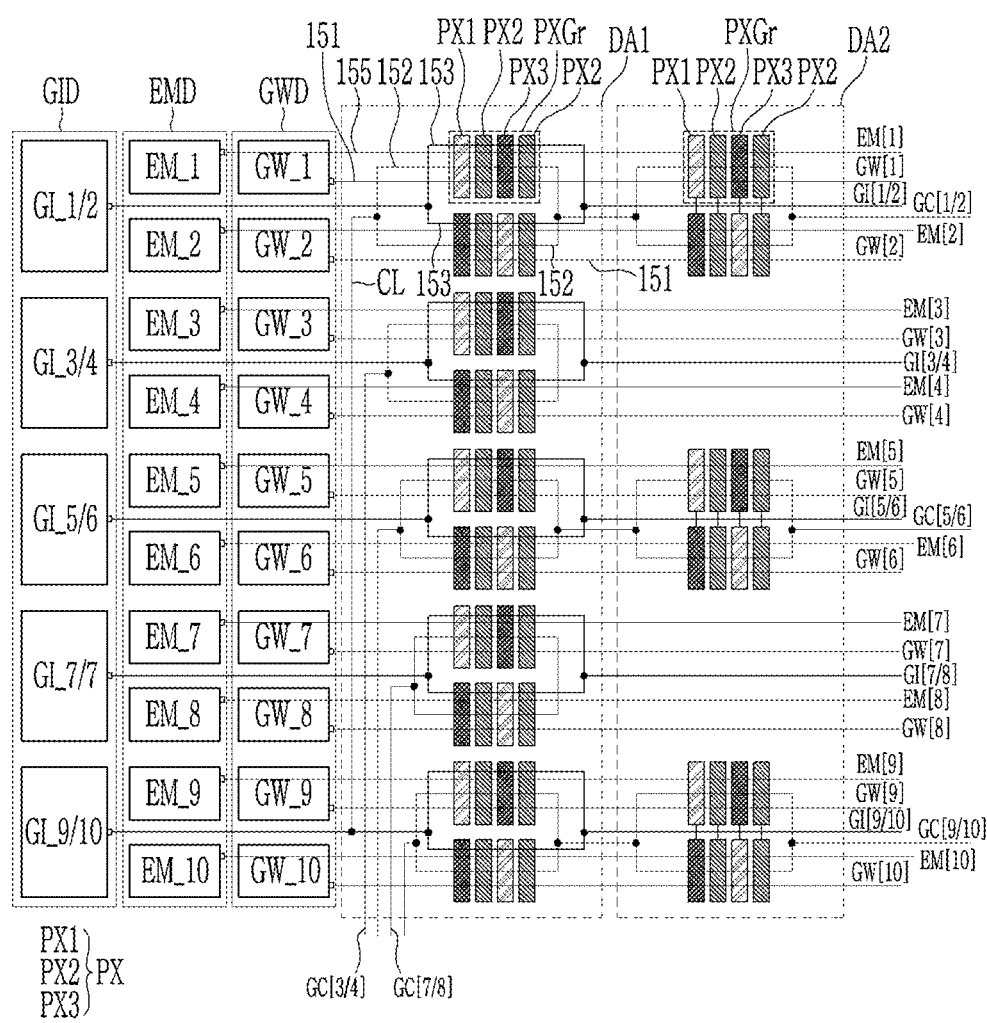
FIG. 10 is a view showing a connection relationship of some pixels and wires of a display device according to another exemplary embodiment.

The display device according to an exemplary embodiment shown in FIG. 10 is the same as most of the display device according to the exemplary embodiment shown in FIG. 7 to FIG. 9 such that the description of the same parts is omitted. The present exemplary embodiment differs from the previous exemplary embodiment in that the number of initialization control lines in the second region is further reduced, and this is further described below.

FIG. 10 is a view showing a connection relationship of some pixels and wires of a display device according to an exemplary embodiment.

As shown in FIG. 10, the display device according to an exemplary embodiment includes a plurality of pixels PX, and a plurality of wires 151, 152, 153, and 155 connected to the plurality of pixels PX to transmit signals.

The display area DA may include a first region DA1 and a second region DA2, and the number of pixels PX per unit area in second region DA2 is less than the number of pixels PX per unit area in the first region DA1.

The plurality of wires may include a first scan line 151, a second scan line 152, an initialization control line 153, and a light emission control line 155.

The initialization control line 153 is connected to each pixel PX. In the case of the previous exemplary embodiment, in the second region DA2, the pixels PX of the first row and the pixels PX of the second row may be connected to the different initialization control lines 153 from each other, and the initialization control line 153 connected to the pixels PX of the first row may be connected to the initialization control line 153 connected to the pixels PX of the second row. In the case of the present exemplary embodiment, in the second region DA2, the pixels PX of the first row and the pixels PX of the second row are connected to the same initialization control line 153. In this case, the initialization control line 153 may be disposed between the pixels PX of the first row and the pixels PX of the second row. Likewise, in the second region DA2, the pixels PX of the fifth row and the pixels PX of the sixth row are connected to the same initialization control line 153. In this case, the initialization control line 153 may be disposed between the pixels PX of the fifth row and the pixels PX of the sixth row. That is, the pixels PX of two adjacent rows in the second region DA2 may be connected to the same initialization control line 153. Therefore, the number of initialization control lines 153 per unit area in the second region DA2 is less than the number of initialization control lines 153 per unit area in the first region DA1. For example, the number of initialization control lines 153 per unit area in the second region DA2 may be about half of the number of initialization control lines 153 per unit area in the first region DA1. In this case, the pixels of the two adjacent rows in the second region DA2 may have a flip structure that is symmetrical up and down based on the initialization control line 153.

Next, the display device according to an exemplary embodiment is described with reference to FIG. 11 to FIG. 30.

The display device according to the exemplary embodiment shown in FIG. 11 to FIG. 30 is the same as most of the display device according to the exemplary embodiment shown in FIG. 1 to FIG. 10 such that the description for the same parts is omitted. The present exemplary embodiment is different from the previous exemplary embodiment in that the channel length of the driving transistor and the capacitance of the storage capacitor are different in the first region and the second region, and this is further described below.

First, the pixel of the first region of the display device according to an exemplary embodiment is described with reference to FIG. 11 to FIG. 19.

Figure 11:
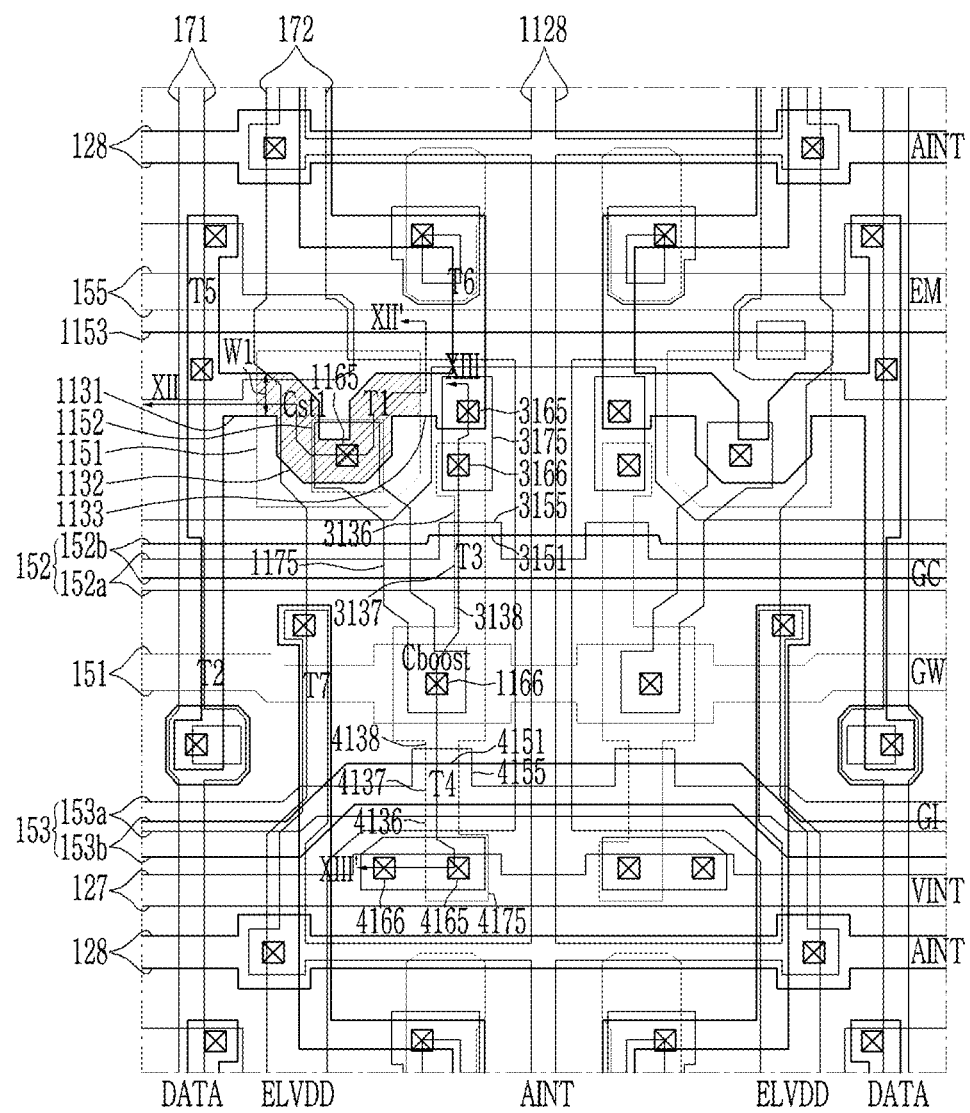
FIG. 11 is a top plan view of some pixels of a first region of a display device according to an exemplary embodiment.
Figure 12:
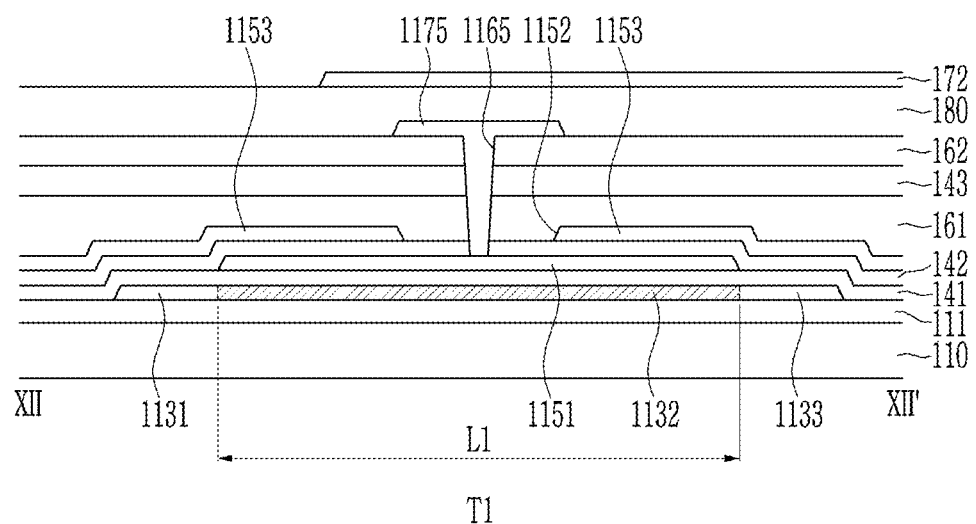
FIG. 12 is a cross-sectional view taken along line XII-XII' of FIG. 11.
Figure 13:
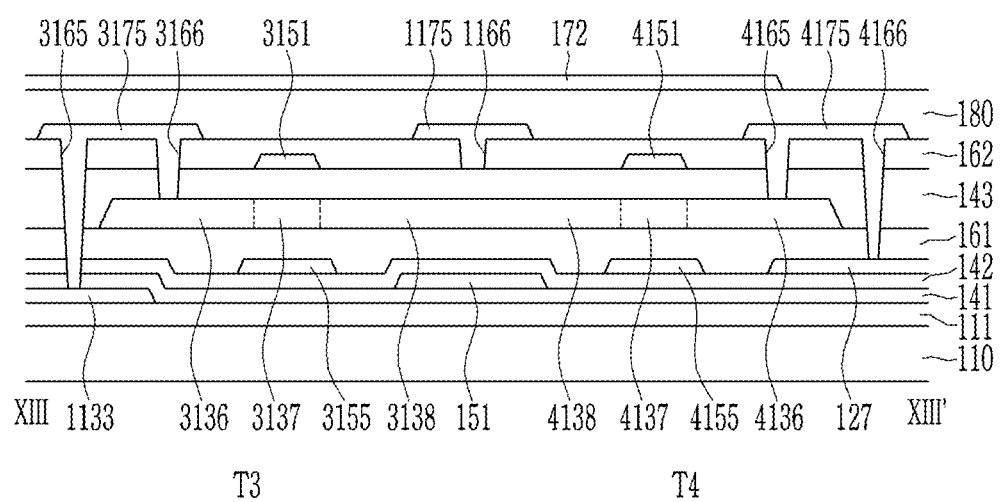
FIG. 13 is a cross-sectional view taken along line XIII-XIII' of FIG. 11.

FIG. 11 is a top plan view of some pixels of a first region of a display device according to an exemplary embodiment, FIG. 12 is a cross-sectional view taken along line XII-XII' of FIG. 11, FIG. 13 is a cross-sectional view taken along line XIII-XIII' of FIG. 11, and FIG. 14 to FIG. 19 are top plan views of some pixels of a first region sequentially shown according to a manufacturing sequence of a display device according to an exemplary embodiment.

FIG. 11 to FIG. 19 show two adjacent pixels among the plurality of pixels disposed in the first region of the display device according to an exemplary embodiment, and correspond to the circuit diagram shown in FIG. 3. However, the present exemplary embodiment is not limited to this and may have a pixel structure that is modified to correspond to the circuit diagram shown in FIG. 6, or may be variously changed in another exemplary embodiment.

Figure 14:
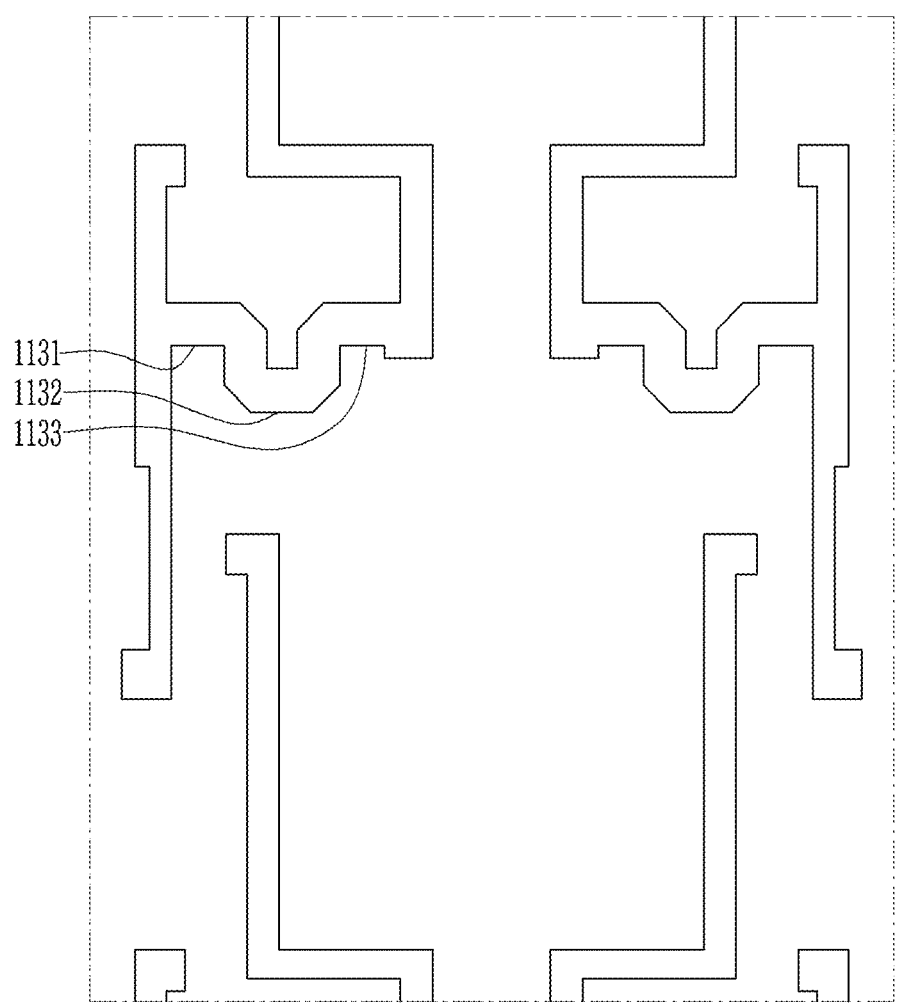
FIG. 14 to FIG. 19 are top plan views of some pixels of a first region sequentially showing a manufacturing sequence of a display device according to an exemplary embodiment.

As shown in FIG. 11 to FIG. 19, the polycrystalline semiconductor including a channel 1132, a first electrode 1131, and a second electrode 1133 of the driving transistor T1 may be disposed on a substrate 110. FIG. 14 shows the polycrystalline semiconductor. The polycrystalline semiconductor may further include each channel, first electrode, and the second electrode of the second transistor T2, the fifth transistor T5, the sixth transistor T6, and the seventh transistor T7 as well as the driving transistor T1.

The channel 1132 of the driving transistor T1 may be formed in a curved shape on a plane. However, the shape of the channel 1132 of the driving transistor T1 is not limited thereto, and may be variously changed in another exemplary embodiment. For example, the channel 1132 of the driving transistor T1 may be bent in a different shape, or may be formed in a rod shape. The first electrode 1131 and the second electrode 1133 of the driving transistor T1 may be disposed on both sides of the channel 1132 of the driving transistor T1. The first electrode 1131 of the driving transistor T1 extends up and down on a plane, so that the portion extending downward may be connected to the second electrode of the second transistor T2, and the portion extending upward may be connected to the second electrode of the fifth transistor T5. The second electrode 1133 of the driving transistor T1 extends upward on a plane, and may be connected to the first electrode of the sixth transistor T6.

A buffer layer 111 may be disposed between the substrate 110 and the polycrystalline semiconductor including the channel 1132, the first electrode 1131, and the second electrode 1133 of the driving transistor T1. The buffer layer 111 may have a single layer or multi-layered structure. The buffer layer 111 may include an organic insulating material or an inorganic insulating material.

A first gate insulating layer 141 may be disposed on the polycrystalline semiconductor including the channel 1132, the first electrode 1131, and the second electrode 1133 of the driving transistor T1. The first gate insulating layer 141 may include a silicon nitride, a silicon oxide, and the like.

Figure 15:
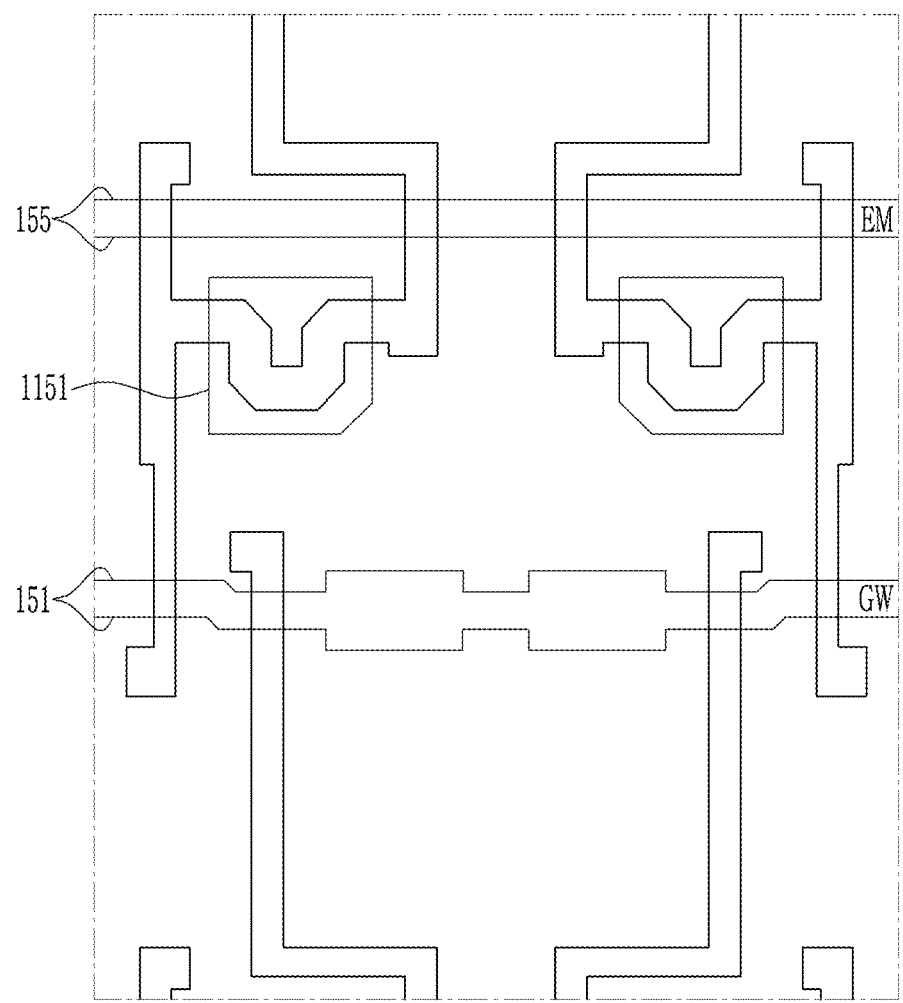

A first gate conductor including a gate electrode 1151 of a driving transistor T1 may be disposed on the first gate insulating layer 141. FIG. 15 shows the polycrystalline semiconductor and the first gate conductor together. The first gate conductor may further include each gate electrode of a second transistor T2, a fifth transistor T5, a sixth transistor T6, and a seventh transistor T7 as well as the driving transistor T1.

The gate electrode 1151 of the driving transistor T1 may overlap the channel 1132 of the driving transistor T1. The channel 1132 of the driving transistor T1 is covered by the gate electrode 1151 of the driving transistor T1.

The first gate conductor may further include a first scan line 151 and a light emission control line 155. The first scan line 151 and the light emission control line 155 may extend approximately in a horizontal direction. The first scan line 151 may be connected to the gate electrode of the second transistor T2 and the first electrode of the boost capacitor Cboost. The first scan line 151 may be connected to the gate electrode of the seventh transistor T7 disposed at the pixel of the next stage. That is, the bypass control line connected to the seventh transistor T7 may consist of the first scan line 151 of the front stage. The gate electrode of the fifth transistor T5 and the gate electrode of the sixth transistor T6 may be connected to the light emission control line 155.

A doping process may be performed after forming the first gate conductor including the gate electrode 1151 of the driving transistor T1. The polycrystalline semiconductor covered by the first gate conductor is not doped, and part of the polycrystalline semiconductor that is not covered by the first gate conductor is doped, thereby having the same characteristic as the conductor. In this case, the doping process with a p-type dopant may be performed, and the driving transistor T1, the second transistor T2, the fifth transistor T5, the sixth transistor T6, and the seventh transistor T7 including the polycrystalline semiconductor may have a p-type transistor characteristic.

A second gate insulating layer 142 may be disposed on the first gate conductor including the gate electrode 1151 of the driving transistor T1 and the first gate insulating layer 141. The second gate insulating layer 142 may include a silicon nitride, a silicon oxide, and the like.

Figure 16:
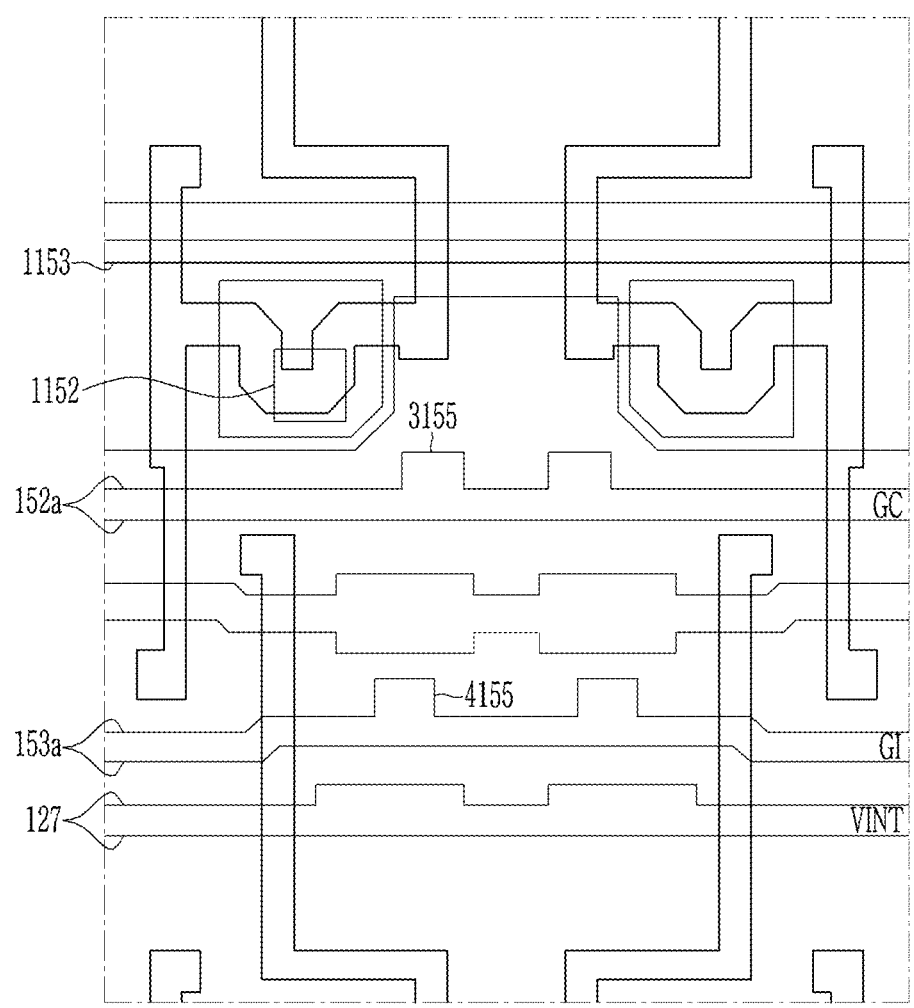

On the second gate insulating layer 142, a second gate conductor including a first storage electrode 1153 of the storage capacitor Cst1, a light blocking layer 3155 of the third transistor T3, and a light blocking layer 4155 of the fourth transistor T4 may be disposed. FIG. 16 shows the polycrystalline semiconductor, the first gate conductor, and the second gate conductor together.

The first storage electrode 1153 overlaps the gate electrode 1151 of the driving transistor T1, thereby forming the storage capacitor Cst1. An opening 1152 is formed in the first storage electrode 1153 of the storage capacitor Cst1. The opening 1152 of the first storage electrode 1153 of the storage capacitor Cst1 may overlap the gate electrode 1151 of the driving transistor T1. The light blocking layer 3155 of the third transistor T3 may overlap a channel 3137 and a gate electrode 3151 of the third transistor T3. The light blocking layer 4155 of the fourth transistor T4 may overlap a channel 4137 and a gate electrode 4151 of the fourth transistor T4.

The second gate conductor may further include a lower second scan line 152a, a lower initialization control line 153a, and an initialization voltage line 127. The lower second scan line 152a, the lower initialization control line 153a, and the initialization voltage line 127 may extend approximately in the horizontal direction. The lower second scan line 152a may be connected to the light blocking layer 3155 of the third transistor T3

The lower initialization control line 153a may be connected to the light blocking layer 4155 of the fourth transistor T4.

A first interlayer insulating layer 161 may be disposed on the second gate conductor including the first storage electrode 1153 of the storage capacitor Cst1, the light blocking layer 3155 of the third transistor T3, and the light blocking layer 4155 of the fourth transistor T4. The first interlayer insulating layer 161 may include a silicon nitride, a silicon oxide, and the like.

Figure 17:
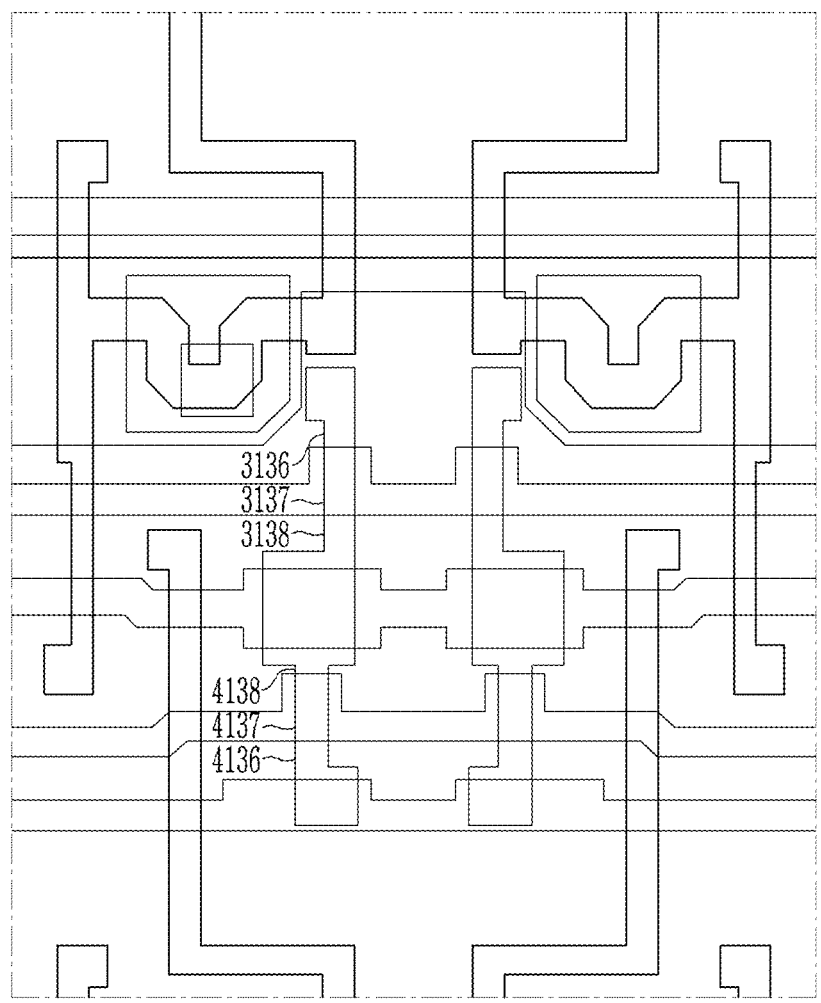

On the first interlayer insulating layer 161, an oxide semiconductor including a channel 3137, a first electrode 3136, and a second electrode 3138 of the third transistor T3, and a channel 4137, a first electrode 4136, and a second electrode 4138 of the fourth transistor T4 may be disposed. FIG. 17 shows the polycrystalline semiconductor, the first gate conductor, the second gate conductor, and the oxide semiconductor together.

The oxide semiconductor may include at least one among a primary metal oxide such as indium (In) oxide, tin (Sn) oxide, or zinc (Zn) oxide, a binary metal oxide such as In-Zn based oxides, Sn-Zn based oxides, Al-Zn based oxides, Zn-Mg based oxides, Sn-Mg based oxides, In-Mg based oxides, or In-Ga based oxides, a ternary metal oxide such as In-Ga-Zn based oxides, In-Al-Zn based oxides, In-Sn-Zn based oxides, Sn-Ga-Zn based oxides, Al-Ga-Zn based oxides, Sn-Al-Zn based oxides, In-Hf-Zn based oxides, In-La-Zn based oxides, In-Ce-Zn based oxides, In-Pr-Zn based oxides, In-Nd-Zn based oxides, In-Sm-Zn based oxides, In-Eu-Zn based oxides, In-Gd-Zn based oxides, In-Tb-Zn based oxides, In-Dy-Zn based oxides, In-Ho-Zn based oxides, In-Er-Zn based oxides, In-Tm-Zn based oxides, In-Yb-Zn based oxides, or In-Lu-Zn based oxides, and a quaternary metal oxide such as In-Sn-Ga-Zn based oxides, In-Hf-Ga-Zn based oxides, In-Al-Ga-Zn based oxides, In-Sn-Al-Zn based oxides, In-Sn-Hf-Zn based oxides, or In-Hf-Al-Zn based oxides. For example, the oxide semiconductor may include Indium-Gallium-Zinc Oxide ("IGZO") among the In-Ga-Zn-based oxide.

The channel 3137, the first electrode 3136, and the second electrode 3138 of the third transistor T3, and the channel 4137, the first electrode 4136, and the second electrode 4138 of the fourth transistor T4, may be connected to each other to be one body. The first electrode 3136 and the second electrode 3138 of the third transistor T3 may be disposed at both sides of the channel 3137 of the third transistor T3. The first electrode 4136 and the second electrode 4138 of the fourth transistor T4 may be disposed at both sides of the channel 4137 of the fourth transistor T4. The second electrode 3138 of the third transistor T3 may be connected to the second electrode 4138 of the fourth transistor T4. The channel 3137 of the third transistor T3 may overlap the light blocking layer 3155. The channel 4137 of the fourth transistor T4 may overlap the light blocking layer 4155.

The oxide semiconductor may further include the second electrode of the boost capacitor Cboost. The second electrode of the boost capacitor Cboost may be connected to the second electrode 3138 of the third transistor T3. The second electrode of the boost capacitor Cboost may be connected to the second electrode 4138 of the fourth transistor T4. The second electrode of the boost capacitor Cboost may overlap the first electrode of the boost capacitor Cboost. The capacitance of the boost capacitor Cboost may be determined by the overlapping area of the first electrode and the second electrode of the boost capacitor Cboost, the thickness of the second gate insulating layer 142, and the first interlayer insulating layer 161 disposed between the first electrode and the second electrode.

A third gate insulating layer 143 may be disposed on the oxide semiconductor including the channel 3137, the first electrode 3136, and the second electrode 3138 of the third transistor T3, and the channel 4137, the first electrode 4136, and the second electrode 4138 of the fourth transistor T4. The third gate insulating layer 143 may be disposed on the entire surface of the oxide semiconductor and the first interlayer insulating layer 161. Accordingly, the third gate insulating layer 143 may cover the upper surface and the side surface of the channel 3137, the first electrode 3136, and the second electrode 3138 of the third transistor T3, and the channel 4137, the first electrode 4136, and the second electrode 4138 of the fourth transistor T4. However, the present exemplary embodiment according to the invention is not limited thereto, and the third gate insulating layer 143 may not be disposed on the entire surface of the oxide semiconductor and the first interlayer insulating layer 161. For example, the third gate insulating layer 143 may overlap the channel 3137 of the third transistor T3, but may not overlap the first electrode 3136 and the second electrode 3138. Also, the third gate insulating layer 143 may overlap the channel 4137 of the fourth transistor T4, but may not overlap the first electrode 4136 and the second electrode 4138.

Figure 18:
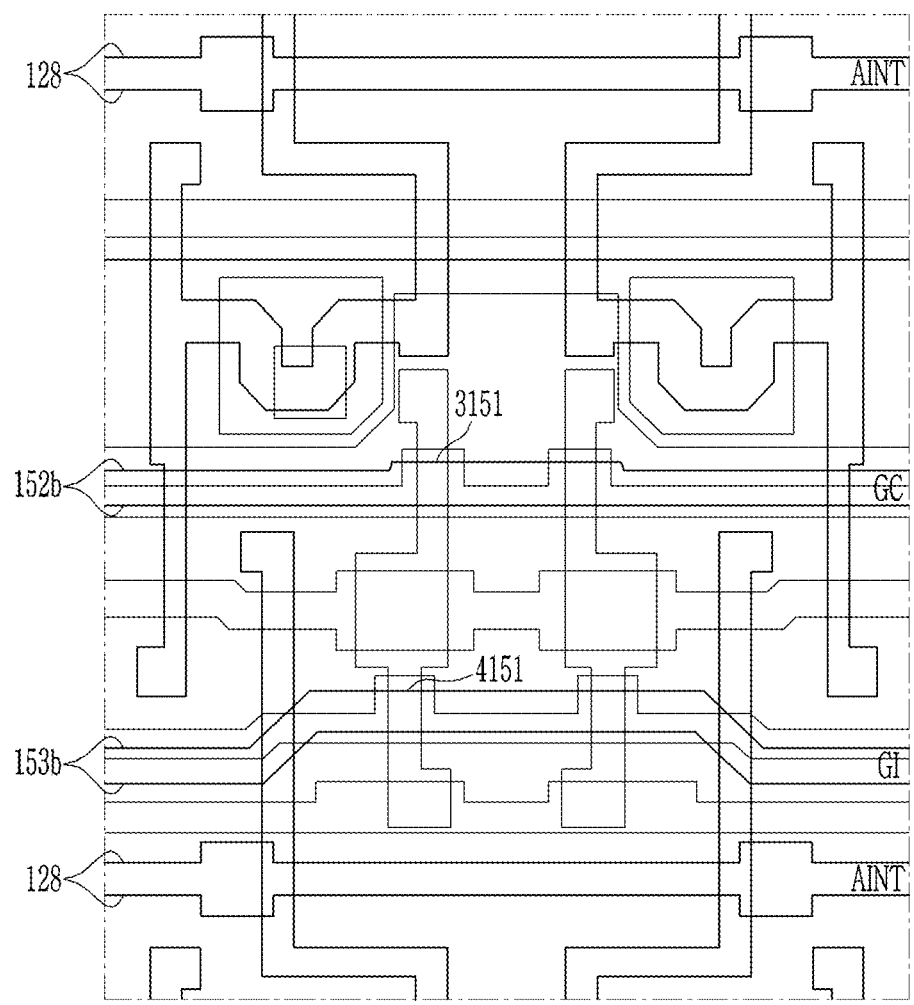

On the third gate insulating layer 143, a third gate conductor including the gate electrode 3151 of the third transistor T3 and the gate electrode 4151 of the fourth transistor T4 may be disposed. FIG. 18 shows the polycrystalline semiconductor, the first gate conductor, the second gate conductor, the oxide semiconductor, and the third gate conductor together.

The gate electrode 3151 of the third transistor T3 may overlap the channel 3137 of the third transistor T3. The gate electrode 3151 of the third transistor T3 may overlap the light blocking layer 3155 of the third transistor T3.

The gate electrode 4151 of the fourth transistor T4 may overlap the channel 4137 of the fourth transistor T4. The gate electrode 4151 of the fourth transistor T4 may overlap the light blocking layer 4155 of the fourth transistor T4.

The third gate conductor may further include a second initialization voltage line 128, an upper second scan line 152b, and an upper initialization control line 153b. The second initialization voltage line 128, the upper second scan line 152b, and the upper initialization control line 153b may extend approximately in the horizontal direction. The upper second scan line 152b forms the second scan line 152 along with the lower second scan line 152a. The upper second scan line 152b may be connected to the gate electrode 3151 of the third transistor T3. The upper initialization control line 153b forms the initialization control line 153 along with the lower initialization control line 153a. The upper initialization control line 153b may be connected to the gate electrode 4151 of the fourth transistor T4.

After forming the third gate conductor including the gate electrode 3151 of the third transistor T3 and the gate electrode 4151 of the fourth transistor T4, the doping process may be performed. The part of the oxide semiconductor covered by the third gate conductor is not doped, and the part of the oxide semiconductor that is not covered by the third gate conductor is doped to have the same characteristic as the conductor. The channel 3137 of the third transistor T3 may be disposed under the gate electrode 3151 to overlap the gate electrode 3151. The first electrode 3136 and the second electrode 3138 of the third transistor T3 may not overlap the gate electrode 3151. The channel 4137 of the fourth transistor T4 may be disposed under the gate electrode 4151 to overlap the gate electrode 4151. The first electrode 4136 and the second electrode 4138 of the fourth transistor T4 may not overlap the gate electrode 4151. The doping process of the oxide semiconductor may be performed with the n-type dopant, and the third transistor T3 and the fourth transistor T4 including the oxide semiconductor may have the n-type transistor characteristic.

A second interlayer insulating layer 162 may be disposed on the third gate conductor including the gate electrode 3151 of the third transistor T3 and the gate electrode 4151 of the fourth transistor T4. The second interlayer insulating layer 162 may have a first opening 1165, a second opening 1166, a third opening 3165, a fourth opening 3166, a fifth opening 4165, and a sixth opening 4166.

The first opening 1165 may overlap at least part of the gate electrode 1151 of the driving transistor T1. The first opening 1165 may be further formed in the third gate insulating layer 143, the first interlayer insulating layer 161, and the second gate insulating layer 142. The first opening 1165 may overlap the opening 1152 of the first storage electrode 1153. The first opening 1165 may be disposed inside the opening 1152 of the first storage electrode 1153. The second opening 1166 may overlap at least part of the boost capacitor Cboost. The second opening 1166 may be further formed in the third gate insulating layer 143.

The third opening 3165 may overlap at least part of the second electrode 1133 of the driving transistor T1. The third opening 3165 may be further formed in the third gate insulating layer 143, the first interlayer insulating layer 161, the second gate insulating layer 142, and the first gate insulating layer 141. The fourth opening 3166 may overlap at least part of the first electrode 3136 of the third transistor T3. The fourth opening 3166 may be further formed in the third gate insulating layer 143.

The fifth opening 4165 may overlap at least part of the second electrode 4138 of the fourth transistor T4. The fifth opening 4165 may be further formed in the third gate insulating layer 143. The sixth opening 4166 may overlap at least part of the first initialization voltage line 127. The sixth opening 4166 may be further formed in the third gate insulating layer 143 and the first interlayer insulating layer 161.

Figure 19:
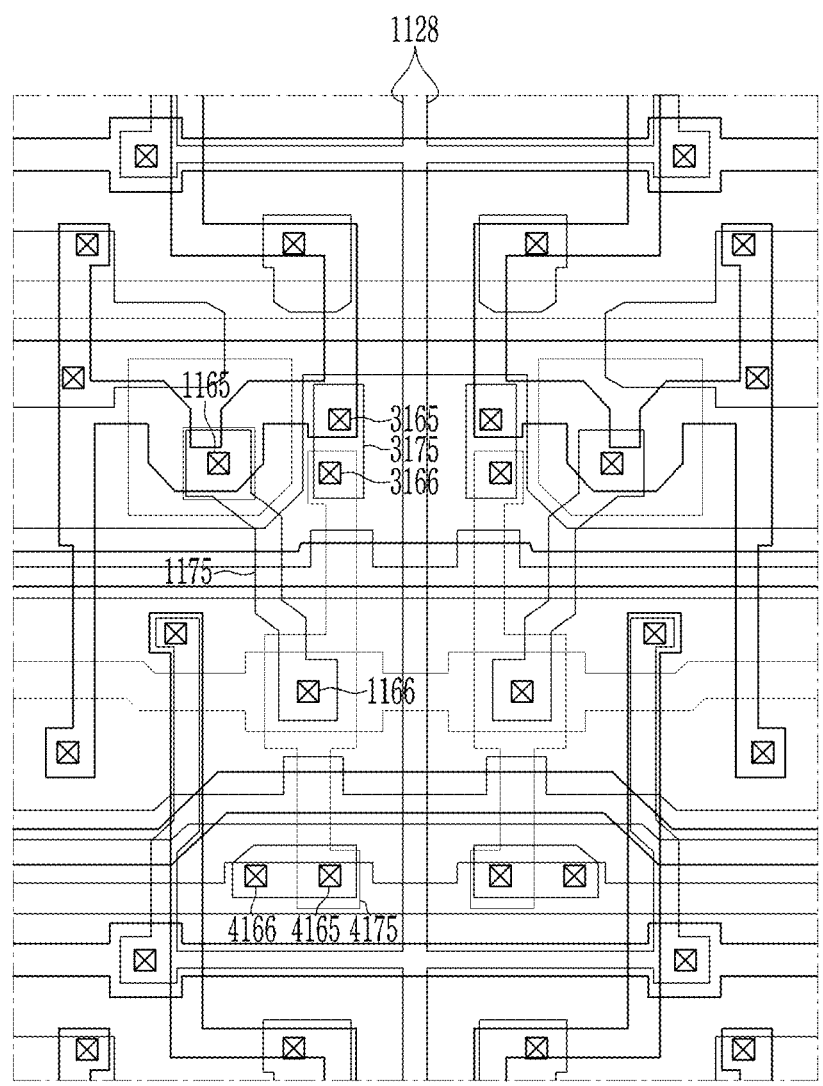

On the second interlayer insulating layer 162, a first data conductor including a first connection electrode 1175, a second connection electrode 3175, and a third connection electrode 4175 may be disposed. FIG. 19 shows the polycrystalline semiconductor, the first gate conductor, the second gate conductor, the oxide semiconductor, the third gate conductor, and the first data conductor together.

The first connection electrode 1175 may overlap the gate electrode 1151 of the driving transistor T1. The first connection electrode 1175 may be connected to the gate electrode 1151 of the driving transistor T1 through the first opening 1165 and the opening 1152 of the first storage electrode 1153. The first connection electrode 1175 may overlap the boost capacitor Cboost. The first connection electrode 1175 may be connected to the second electrode of the boost capacitor Cboost through the second opening 1166. Accordingly, the gate electrode 1151 of the driving transistor T1 and the second electrode of the boost capacitor Cboost may be connected by the first connection electrode 1175. In this case, the gate electrode 1151 of the driving transistor T1 may also be connected to the second electrode 3138 of the third transistor T3 and the second electrode 4138 of the fourth transistor T4 by the first connection electrode 1175.

The second connection electrode 3175 may overlap the second electrode 1133 of the driving transistor T1. The second connection electrode 3175 may be connected to the second electrode 1133 of the driving transistor T1 through the third opening 3165. The second connection electrode 3175 may overlap the first electrode 3136 of the third transistor T3. The second connection electrode 3175 may be connected to the first electrode 3136 of the third transistor T3 through the fourth opening 3166. Accordingly, the second electrode 1133 of the driving transistor T1 and the first electrode 3136 of the third transistor T3 may be connected by the second connection electrode 3175.

The third connection electrode 4175 may overlap the first electrode 4136 of the fourth transistor T4. The third connection electrode 4175 may be connected to the first electrode 4136 of the fourth transistor T4 through the fifth opening 4165. The third connection electrode 4175 may overlap the first initialization voltage line 127. The third connection electrode 4175 may be connected to the first initialization voltage line 127 through the sixth opening 4166. Accordingly, the first electrode 4136 of the fourth transistor T4 and the first initialization voltage line 127 may be connected by the third connection electrode 4175.

The first data conductor may further include a second initialization voltage supply line 1128. The second initialization voltage supply line 1128 may extend approximately in the vertical direction and may be disposed between two adjacent pixels. The second initialization voltage supply line 1128 may be branched left and right at the crossing part with the second initialization voltage line 128. The second initialization voltage supply line 1128 may be connected to the second initialization voltage line 128 to transmit the second initialization voltage AINT.

A third interlayer insulating layer 180 may be disposed on the first data conductor including the first connection electrode 1175, the second connection electrode 3175, and the third connection electrode 4175.

A data line 171 and a driving voltage line 172 may be disposed on the third interlayer insulating layer 180. The data line 171 and the driving voltage line 172 may extend approximately in the vertical direction. The data line 171 may be connected to the second transistor T2. The driving voltage line 172 may be connected to the fifth transistor T5.

Although not shown, a passivation layer may be disposed on the data line 171 and the driving voltage line 172, and an anode may be disposed on the passivation layer. The anode may be connected to the sixth transistor T6 and may receive the output current of the driving transistor T1. A partition wall may be disposed above the anode. An opening is formed in the partition wall, and the opening of the partition wall may overlap the anode. A light-emitting element layer may be disposed in the opening of the partition wall. A cathode may be disposed on the light-emitting element layer and the partition wall. The anode, the light-emitting element layer, and the cathode constitute a light emitting diode LED.

As described above, in the display device according to an exemplary embodiment, the driving transistor T1 may include the polycrystalline semiconductor, and the third transistor T3 and the fourth transistor T4 may include the oxide semiconductor. As described above, by forming the third transistor T3 and the fourth transistor T4 to include the different semiconductor material from the driving transistor T1, the driving may be performed more stably and the reliability may be improved.

In the above, that the first connection electrode 1175 is connected to the second electrode 3138 of the third transistor T3, the second electrode 4138 of the fourth transistor T4, and the second electrode of the boost capacitor Cboost through the second opening 1166 is described with reference to FIG. 11 and FIG. 19. In this exemplary embodiment, the shape of the first connection electrode 1175 and the position of the second opening 1166 may be changed, and this is described with reference to FIG. 20.

Figure 20:
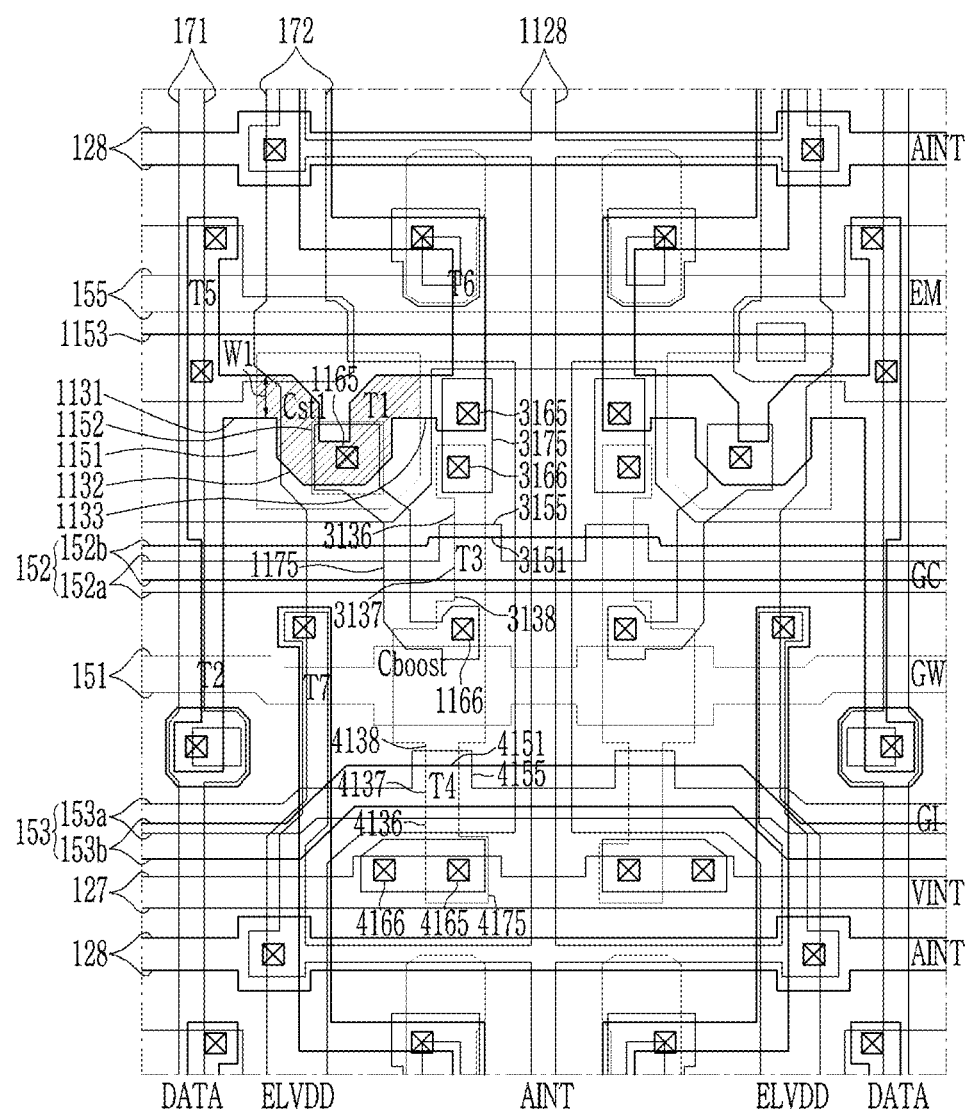
FIG. 20 is a top plan view showing some pixels of a first region of a display device according to an exemplary embodiment.

FIG. 20 is a top plan view showing some pixels of a first region of a display device according to an exemplary embodiment.

As shown in FIG. 20, the first connection electrode 1175 is connected to the second electrode 3138 of the third transistor T3, the second electrode 4138 of the fourth transistor T4, and the second electrode of the boost capacitor Cboost through the second opening 1166, like the exemplary embodiment of FIG. 11. The width of both ends of the first connection electrode 1175 is wider than that of the other portions. In FIG. 11, one end of both ends of the first connection electrode 1175 may overlap the first scan line 151. That is, the first scan line 151, the second electrode of the boost capacitor Cboost, and the first connection electrode 1175 overlap. In FIG. 20, one end of the first connection electrode 1175 is bent to be disposed between the first scan line 151 and the second scan line 152. The first connection electrode 1175 and the first scan line 151 partially overlap, but the overlapping area of the first connection electrode 1175 and the first scan line 151 may be smaller compared with FIG. 11. Therefore, it is possible to minimize the effect on the connection path of the driving transistor T1 and the third transistor T3 by the signal applied to the first scan line 151.

In the above description, the first connection electrode 1175 and the first scan line 151 are partially overlapped, but the present exemplary embodiment according to the invention is not limited thereto. In some cases, the first connection electrode 1175 may not overlap the first scan line 151 at all.

Next, the pixel of the second region of the display device according to an exemplary embodiment is described with reference to FIG. 21 to FIG. 29.

Figure 21:
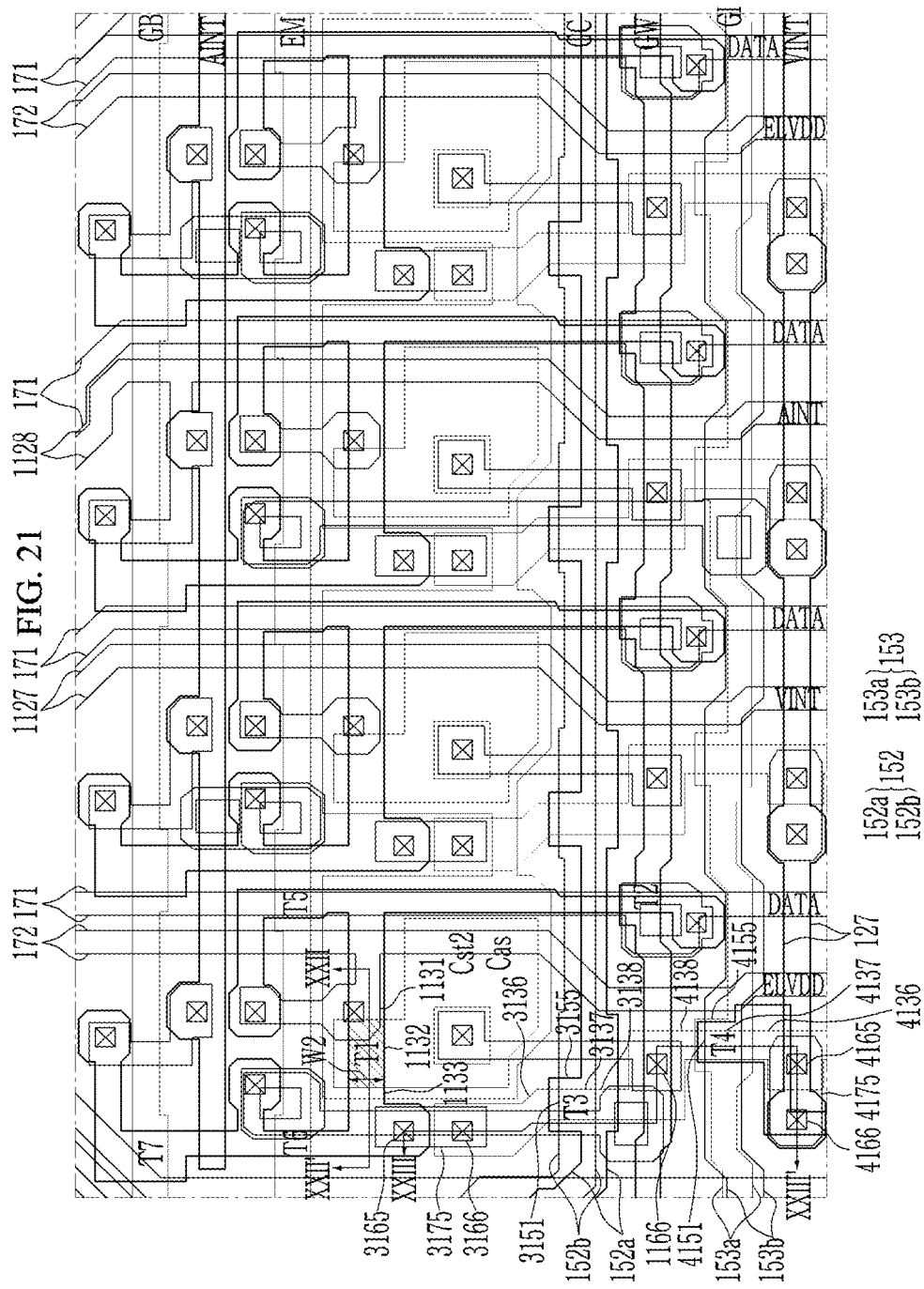
FIG. 21 is a top plan view showing some pixels of a second region of a display device according to an exemplary embodiment.
Figure 22:
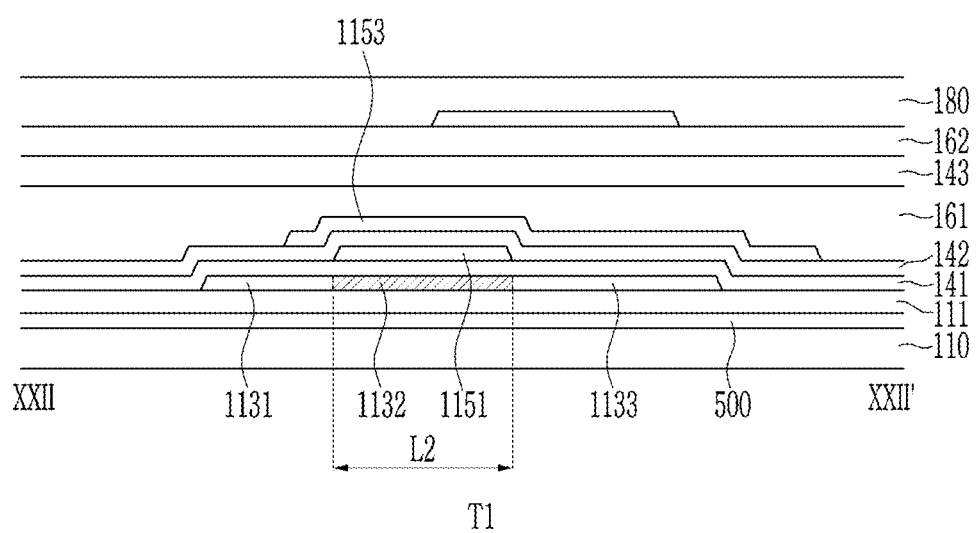
FIG. 22 is a cross-sectional view taken along line XXII-XXII' of FIG. 21.
Figure 23:
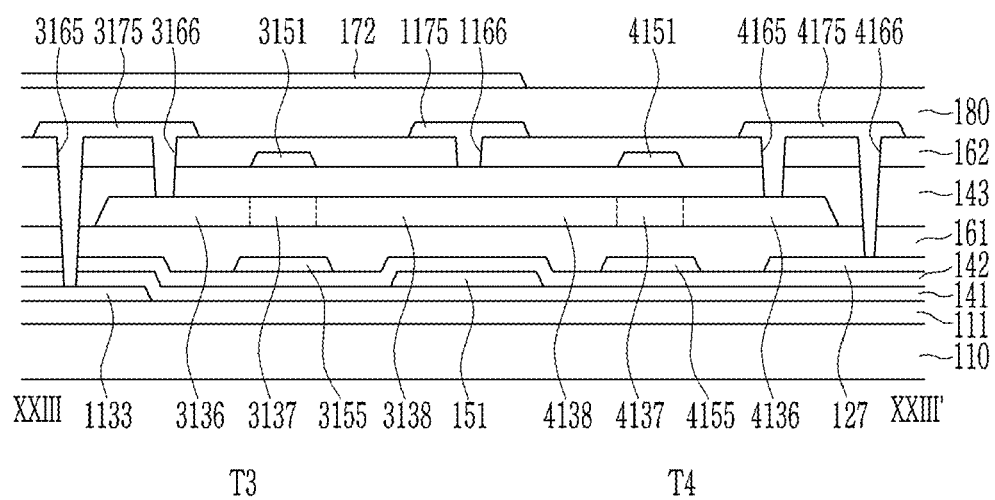
FIG. 23 is a cross-sectional view taken along line XXIII-XXIII' of FIG. 21.

FIG. 21 is a top plan view showing some pixels of a second region of a display device according to an exemplary embodiment. FIG. 22 is a cross-sectional view taken along line XXII-XXII' of FIG. 21, FIG. 23 is a cross-sectional view taken along line XXIII-XXIII' of FIG. 21, and FIG. 24 to FIG. 29 are top plan views of some pixels of a second region sequentially showing a manufacturing sequence of a display device according to an exemplary embodiment.

FIG. 21 to FIG. 29 show four adjacent pixels among the plurality of pixels disposed in the second region of the display device according to an exemplary embodiment, and they correspond to the circuit diagram of FIG. 3. However, the present exemplary embodiment is not limited to this, and may have the modified pixel structure to correspond to the circuit diagram shown in FIG. 6 or may be variously changed in another exemplary embodiment.

In the first region DA1 and the second region DA2 of the display device according to an exemplary embodiment, each layer may be formed in the same process and may have a substantially similar pixel structure. However, it may be designed so as to differentiate the specifications of some layers, and specifically, the width and length of the channel of the driving transistor T1 may be designed differently. It will be further described below.

As shown in FIG. 21 to FIG. 29, a light blocking member 500 may be disposed on a substrate 110. The light blocking member 500 may be disposed entirely in the second region DA2. The light blocking member 500 may not be disposed in the first region DA1. That is, after forming the light blocking member 500 as a whole on the substrate 110, the light blocking member 500 positioned in the first region DA1 may be patterned to be removed. Although not illustrated, a separate insulating layer, buffer layer, etc. may be disposed between the substrate 110 and the light blocking member 500.

Figure 24:
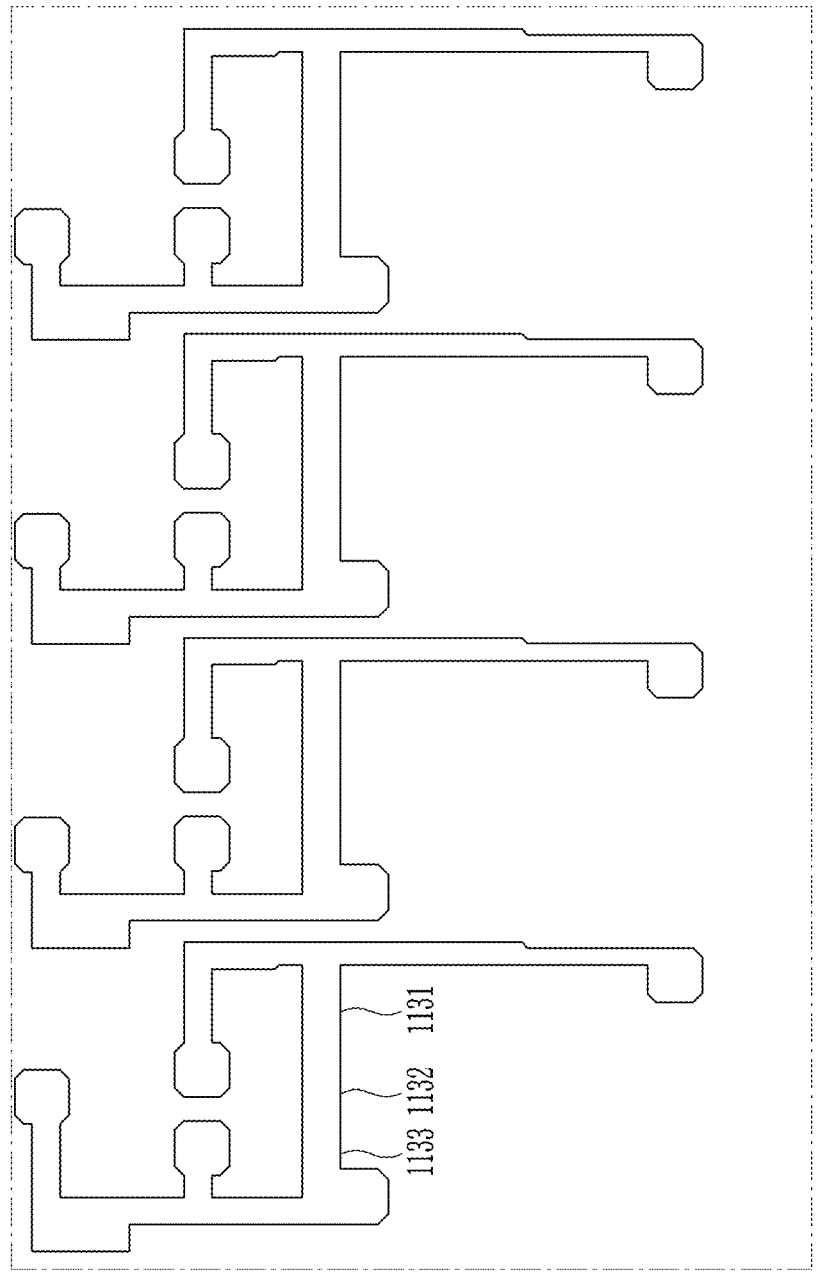
FIG. 24 to FIG. 29 are top plan views of some pixels of a second region sequentially showing a manufacturing sequence of a display device according to an exemplary embodiment.

The polycrystalline semiconductor including the channel 1132, the first electrode 1131, and the second electrode 1133 of the driving transistor T1 may be disposed on the light blocking member 500. FIG. 24 shows the polycrystalline semiconductor.

The channel 1132 of the driving transistor T1 may be formed in a rod shape on a plane. However, the shape of the channel 1132 of the driving transistor T1 according to the invention is not limited thereto, and may be variously changed in another exemplary embodiment. In the first region DA1 and the second region DA2, the plane shape of the channel 1132 of the driving transistor T1 may be different. For example, the plane shape of the channel 1132 of the driving transistor T1 may be formed of a curved shape in the first region DA1 and may be formed of a rod shape in the second region DA2.

The buffer layer 111 may be disposed between the light blocking member 500 and the polycrystalline semiconductor. The first gate insulating layer 141 may be disposed on the polycrystalline semiconductor.

Figure 25:
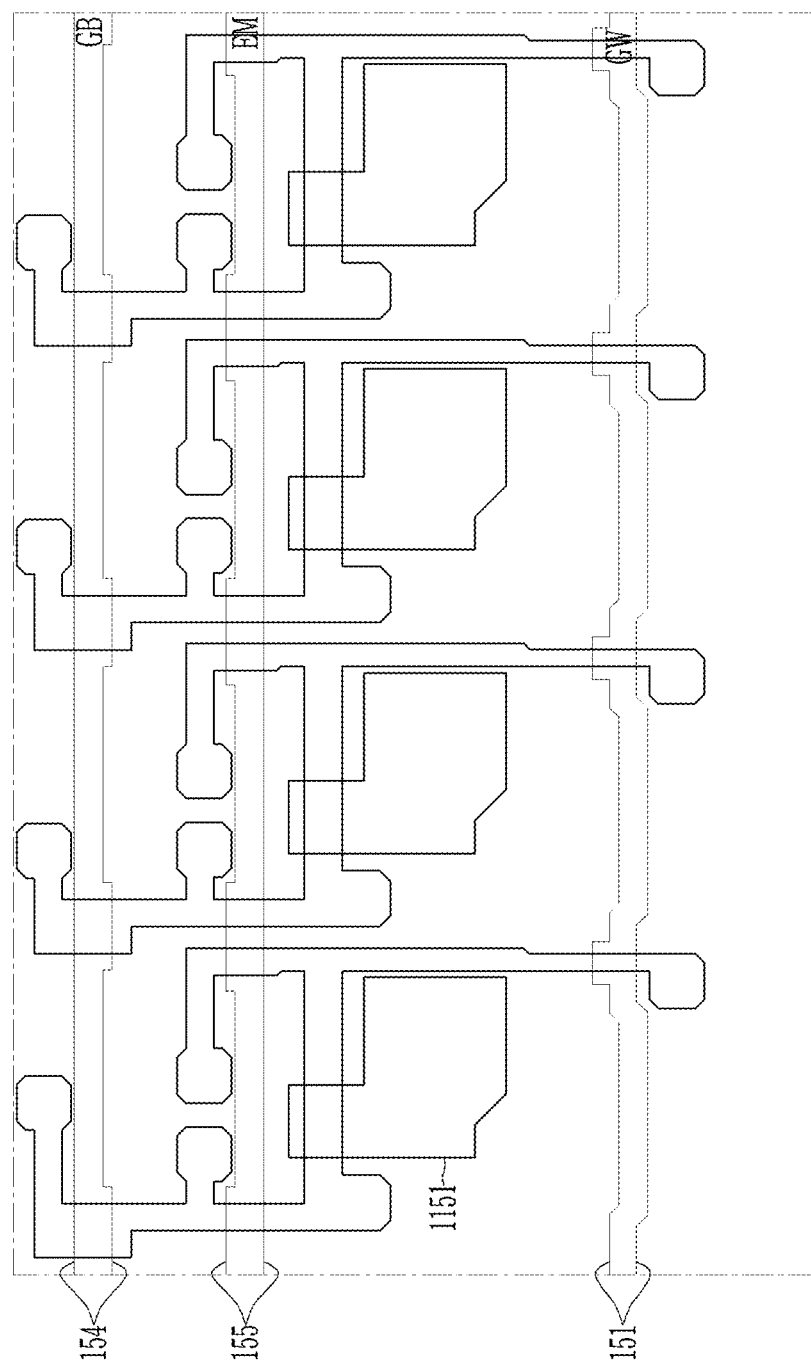

The first gate conductor including the gate electrode 1151 of the driving transistor T1 may be disposed on the first gate insulating layer 141. FIG. 25 shows the polycrystalline semiconductor and the first gate conductor together.

The gate electrode 1151 of the driving transistor T1 may overlap the channel 1132 of the driving transistor T1. The channel 1132 of the driving transistor T1 is covered by the gate electrode 1151 of the driving transistor T1. The overlapping area between the gate electrode 1151 of the driving transistor T1 and the polycrystalline semiconductor in the first region DA1 and the overlapping area between the gate electrode 1151 of the driving transistor T1 and the polycrystalline semiconductor in the second region DA2 may be different. Also, the width W1 (See FIGS. 11 and 20) of the channel 1132 of the driving transistor T1 in the first region DA1 and the width W2 (See FIG. 21) of the channel 1132 of the driving transistor T1 in the second region DA2 may be different. Further, the length L1 (See FIG. 12) of the channel 1132 of the driving transistor T1 in the first region DA1 and the length L2 (See FIG. 22) of the channel 1132 of the driving transistor T1 in the second region DA2 may be different. In addition, a ratio W1/L1 of the width W1 to the length L1 of the channel 1132 of the driving transistor T1 in the first region DA1 and a ratio W2/L2 of the width W2 to the length L2 of the channel 1132 of the driving transistor T1 in the second region DA2 may be different.

The gate electrode 1151 of the driving transistor T1 overlaps the light blocking member 500 to form an auxiliary capacitor Cas. The light blocking member 500 may be disposed between the substrate 110 and the gate electrode 1151 of the driving transistor T1. The buffer layer 111 and the first gate insulating layer 141 may be disposed between the light blocking member 500 and the gate electrode 1151. Since the light blocking member 500 is disposed in the entirety of the second region DA2, it overlaps not only the driving transistor T1 but also the gate electrodes of the second to seventh transistors T2, T3, T4, T5, T6, and T7 to form the auxiliary capacitor Cas. The capacitance of the auxiliary capacitor Cas may be determined by the overlapping area between the light blocking member 500 and the gate electrode 1151 of the driving transistor T1 and the thickness of the buffer layer 111 and the first gate insulating layer 141 disposed between the light blocking member 500 and the gate electrode 1151 of the driving transistor T1.

The first gate conductor may further include the first scan line 151, the light emission control line 155, and the bypass control line 154. A second gate insulating layer 142 may be disposed on the first gate conductor and the first gate insulating layer 141.

Figure 26:
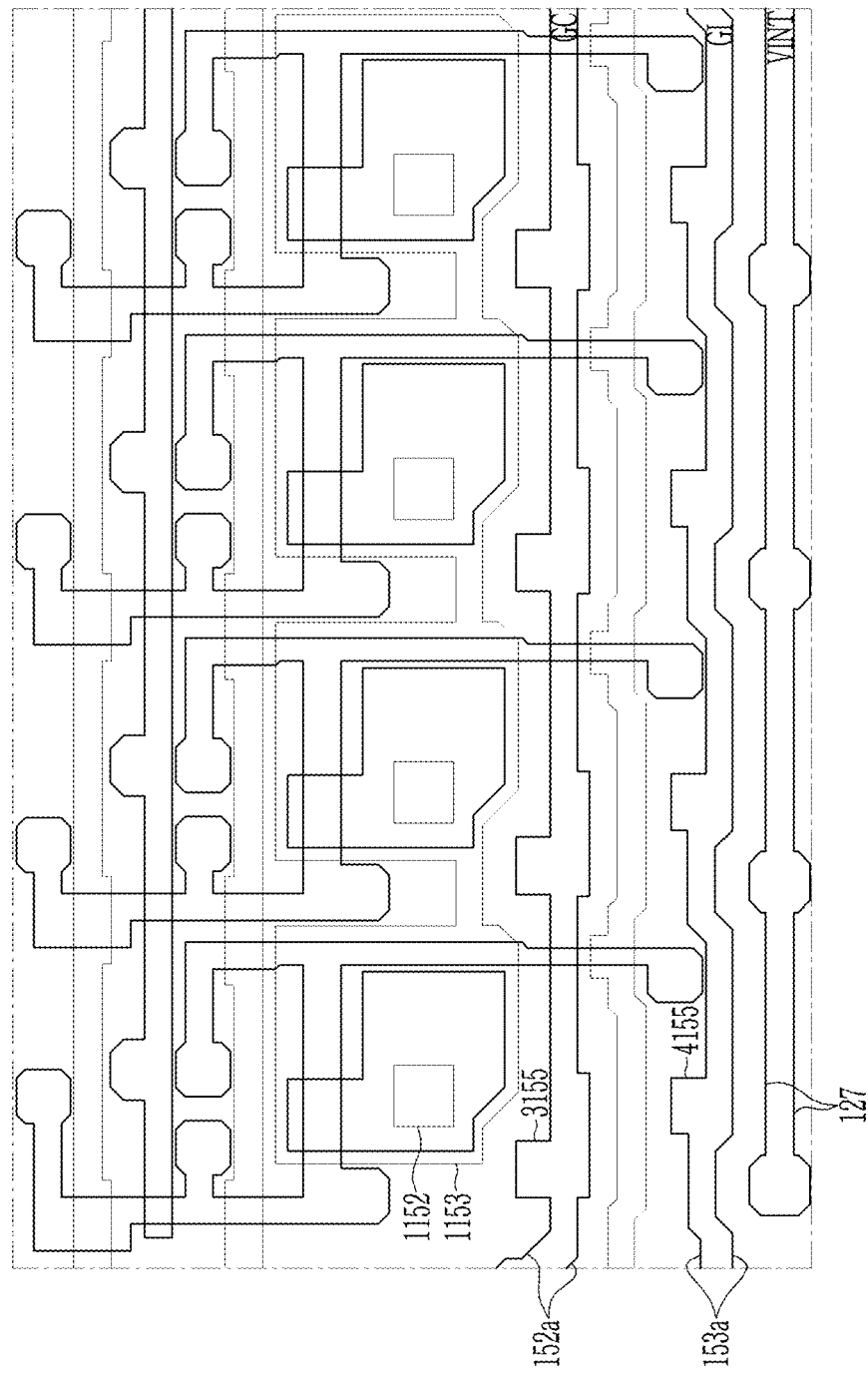

A second gate conductor including a first storage electrode 1153 of the storage capacitor Cst2, a light blocking layer 3155 of a third transistor T3, and a light blocking layer 4155 of a fourth transistor T4 may be disposed on the second gate insulating layer 142. FIG. 26 shows together the polycrystalline semiconductor, the first gate conductor, and the second gate conductor together.

The first storage electrode 1153 overlaps the gate electrode 1151 of the driving transistor T1 to form the storage capacitor Cst2. The capacitance of the storage capacitor Cst2 may be determined by the overlapping area between the gate electrode 1151 of the driving transistor T1 and the first storage electrode 1153 and the thickness of the second gate insulating layer 142 between the gate electrode 1151 of the driving transistor T1 and the first storage electrode 1153. The overlapping area between the gate electrode 1151 of the driving transistor T1 and the first storage electrode 1153 in the first region DA1 and the overlapping area between the gate electrode 1151 of the driving transistor T1 and the first storage electrode 1153 in the second region DA2 may be different. Accordingly, the capacitance of the storage capacitor Cst2 in the first region DA1 and the capacitance of the storage capacitor Cst2 in the second region DA2 may be different.

In the present exemplary embodiment, the number of pixels PX per unit area in the second region DA2 is less than the number of pixels PX per unit area in the first region DA1. Accordingly, when the pixel PX disposed in the first region DA1 and the pixel PX positioned in the second region DA2 have the same structure and are driven by the same voltage, the luminance of the second region DA2 may be lower than that of the first region DA1. Accordingly, a boundary between the first region DA1 and the second region DA2 may be recognized. In the present exemplary embodiment, the pixels PX disposed in the second region DA2 have similar luminance to that of the pixels PX disposed in the first region DA1 by differentiating the structure of the pixels PX disposed in the first region DA1 and the second region DA2, so that the boundary between the first region DA1 and the second region DA2 is not recognized and the image may be displayed naturally. Next, the differences of the length and width of the channel of the driving transistor T1 between the first region DA1 and the second region DA2 and the capacitances of the storage capacitors Cst1 and Cst2 and the auxiliary capacitor Cas are described.

Table 1 shows channel lengths W1 and W2 of the driving transistor T1, a capacitance of the storage capacitors Cst1 and Cst2, and a capacitance of the auxiliary capacitor Cas when the luminance of the second region DA2 for the first region DA1 is 60%, 80% and 100% in the first pixel PX1 representing red, respectively.

In the first region DA1 and the second region DA2, the widths W1 and W2 of the channels of the driving transistors T1 are all set to 3.5 micrometers (μm).

TABLE 1

| First pixel (red) | First region | Second region 60% | | Second region 80% | | Second region 100% | |
|---|---|---|---|---|---|---|---|
| Channel length (μm) | 18.55 | 10 | 9 | 11 | 12 | 11 | 12 |
| Channel width/length (W/L) | 0.189 | 0.35 | 0.389 | 0.318 | 0.292 | 0.318 | 0.292 |
| Ratio ((W2/L2)/(W1/L1)) (%) | — | 185 | 206 | 168 | 155 | 168 | 155 |
| Capacitance (microfarads: μF) of storage capacitors Cst1 and Cst2 | 81.8 | 70.4 | | 96.9 | | 114.6 | |
| Ratio (Cst2/Cst1, %) | — | 86 | | 118 | | 140 | |
| Capacitance (μF) of auxiliary capacitor Cas | — | 22.2 | | 26.3 | | 30.6 | |
| Ratio (Cas/Cst1) | — | 27 | | 32 | | 37 | |

In the case of the first pixel PX1 representing red, the ratio W2/L2 of the width W2 to the length L2 of the channel 1132 of the driving transistor T1 in the second region DA2 may be larger than the ratio W1/L1 of the width W1 to the length L1 of the channel 1132 of the driving transistor T1 in the first region DA1. The ratio W2/L2 of the width W2 to the length L2 of the channel 1132 of the driving transistor T1 in the second region DA2 for the ratio W1/L1 of the width W1 to the length L1 of the channel 1132 of the driving transistor T1 in the first region DA1 may be about 168% or more, and about 185% or less. Considering an error range, when a numerical range described in parentheses is considered, the ratio W2/L2 of the width W2 to the length L2 of the channel 1132 of the driving transistor T1 in the second region DA2 may be greater than or equal to about 155% and less than or equal to about 206% of the ratio W1/L1 of the width W1 to the length L1 of the channel 1132 of the driving transistor T1 in the first region DA1. In the case of the first pixel PX1 displaying red, the capacitance of the storage capacitor Cst2 in the second region DA2 may be about 86% or more and about 140% or less of the capacitance of the storage capacitor Cst1 in the first region DA1. Also, the capacitance of the auxiliary capacitor Cas in the second region DA2 may be about 27% or more and 37% or less of the capacitance of the storage capacitor Cst1 in the first region DA1. Therefore, the sum of the capacitances of the storage capacitor Cst2 and the auxiliary capacitor Cas in the second region DA2 may be about 113% or more and about 177% or less of the capacitance of the storage capacitor Cst1 in the first region DA1.

Table 2 shows channel lengths W1 and W2 of the driving transistor T1, the capacitance of the storage capacitors Cst1 and Cst2, and capacitance of the auxiliary capacitor Cas when the luminance of the second region DA2 for the first region DA1 is 60%, 80%, and 100% in the second pixel PX1 representing green, respectively. In the first region DA1 and the second region DA2, the widths W1 and W2 of the channels of the driving transistors T1 are all set to 3.5 μm.

In the case of the second pixel PX2 representing green, the ratio W2/L2 of the width W2 to the length L2 of the channel 1132 of the driving transistor T1 in the second region DA2 may be larger than the ratio W1/L1 of the width W1 to the length L1 of the channel 1132 of the driving transistor T1 in the first region DA1. The ratio W2/L2 of the width W2 to the length L2 of the channel 1132 of the driving transistor T1 in the second region DA2 may be about 168% or more and about 185% or less of the ratio W1/L1 of the width W1 to the length L1 of the channel 1132 of the driving transistor T1 in the first region DA1. Considering an error range, when a numerical range described in parentheses is considered, the ratio W2/L2 of the width W2 to the length L2 of the channel 1132 of the driving transistor T1 in the second region DA2 may be greater than or equal to about 155% and less than or equal to about 206% of the ratio W1/L1 of the width W1 to the length L1 of the channel 1132 of the driving transistor T1 in the first region DA1. In the case of the second pixel PX2 displaying green, the capacitance of the storage capacitor Cst2 in the second region DA2 may be about 63% or more and about 90% or less of the capacitance of the storage capacitor Cst1 in the first region DA1. Also, the capacitance of the auxiliary capacitor Cas in the second region DA2 may be about 27% or more and 33% or less of the capacitance of the storage capacitor Cst1 in the first region DA1. Therefore, the sum of the capacitances of the storage capacitor Cst2 and the auxiliary capacitor Cas in the second region DA2 may be about 90% or more and about 123% or less of the capacitance of the storage capacitor Cst1 in the first region DA1.

Table 3 shows channel lengths W1 and W2 of the driving transistor T1, a capacitance of the storage capacitor Cst1 and Cst2, and a capacitance of the auxiliary capacitor Cas when the luminance of the second region DA2 for the first region DA1 is 60%, 80%, and 100% in the third pixel PX1 representing blue, respectively. In the first region DA1 and the second region DA2, the widths W1 and W2 of the channels of the driving transistors T1 are all set to 3.5 μm

TABLE 2

| Second pixel (Green) | First region | Second region 60% | | Second region 80% | | Second region 100% | |
| --- | --- | --- | --- | --- | --- | --- | --- |
| Channel length (μm) | 18.55 | 10 | 9 | 11 | 12 | 11 | 12 |
| Channel width/length (W/L) | 0.189 | 0.35 | 0.389 | 0.318 | 0.292 | 0.318 | 0.292 |
| Ratio ((W2/L2)/(W1/L1)) (%) | — | 185 | 206 | 168 | 155 | 168 | 155 |
| Capacitance (μF) of storage capacitors Cst1 and Cst2 | 52.0 | 32.7 | | 41.3 | | 46.8 | |
| Ratio (Cst2/Cst1, %) | — | 63 | | 79 | | 90 | |
| Capacitance (μF) of auxiliary capacitor Cas | — | 13.9 | | 15.4 | | 17.2 | |
| Ratio (Cas/Cst1) | — | 27 | | 30 | | 33 | |

TABLE 3

| Third pixel (blue) | First region | Second region 60% | | Second region 80% | | Second region 100% | |
|---|---|---|---|---|---|---|---|
| Channel length (μm) | 18.55 | 10 | 9 | 10 | 9 | 10 | 11 |
| Channel width/length (W/L) | 0.189 | 0.35 | 0.389 | 0.35 | 0.389 | 0.35 | 0.318 |
| Ratio ((W2/L2)/(W1/L1)) (%) | — | 185 | 206 | 185 | 206 | 185 | 168 |
| Storage capacitors Cst1 and Cst2 capacitance (μF) | 81.8 | 66.6 | | 99.3 | | 112.1 | |
| Ratio (Cst2/Cst1, %) | — | 81 | | 121 | | 137 | |
| Auxiliary capacitor Cas capacitance (μF) | — | 21.2 | | 26.8 | | 30 | |
| Ratio (Cas/Cst1) | — | 26 | | 33 | | 37 | |

In the case of the second pixel PX2 representing blue, the ratio W2/L2 of the width W2 to the length L2 of the channel 1132 of the driving transistor T1 in the second region DA2 may be larger than the ratio W1/L1 of the width W1 to the length L1 of the channel 1132 of the driving transistor T1 in the first region DA1. The ratio W2/L2 of the width W2 to the length L2 of the channel 1132 of the driving transistor T1 in the second region DA2 may be about 185% of the ratio W1/L1 of the width W1 to the length L1 of the channel 1132 of the driving transistor T1 in the first region DA1. Considering an error range, when a numerical range described in parentheses is considered, the ratio W2/L2 of the width W2 to the length L2 of the channel 1132 of the driving transistor T1 in the second region DA2 may be greater than or equal to about 168% and less than or equal to about 206% of the ratio W1/L1 of the width W1 to the length L1 of the channel 1132 of the driving transistor T1 in the first region DA1. In the case of the third pixel PX3 displaying blue, the capacitance of the storage capacitor Cst2 in the second region DA2 may be about 81% or more and about 137% or less of the capacitance of the storage capacitor Cst1 in the first region DA1. Also, the capacitance of the auxiliary capacitor Cas in the second region DA2 may be about 26% or more and 37% or less of the capacitance of the storage capacitor Cst1 in the first region DA1. Therefore, the sum of the capacitances of the storage capacitor Cst2 and the auxiliary capacitor Cas in the second region DA2 may be about 107% or more and about 174% or less of the capacitance of the storage capacitor Cst1 in the first region DA1.

The second gate conductor may further include a lower second scan line 152a, a lower initialization control line 153a, and an initialization voltage line 127. A first interlayer insulating layer 161 may be disposed on the second gate conductor.

Figure 27:
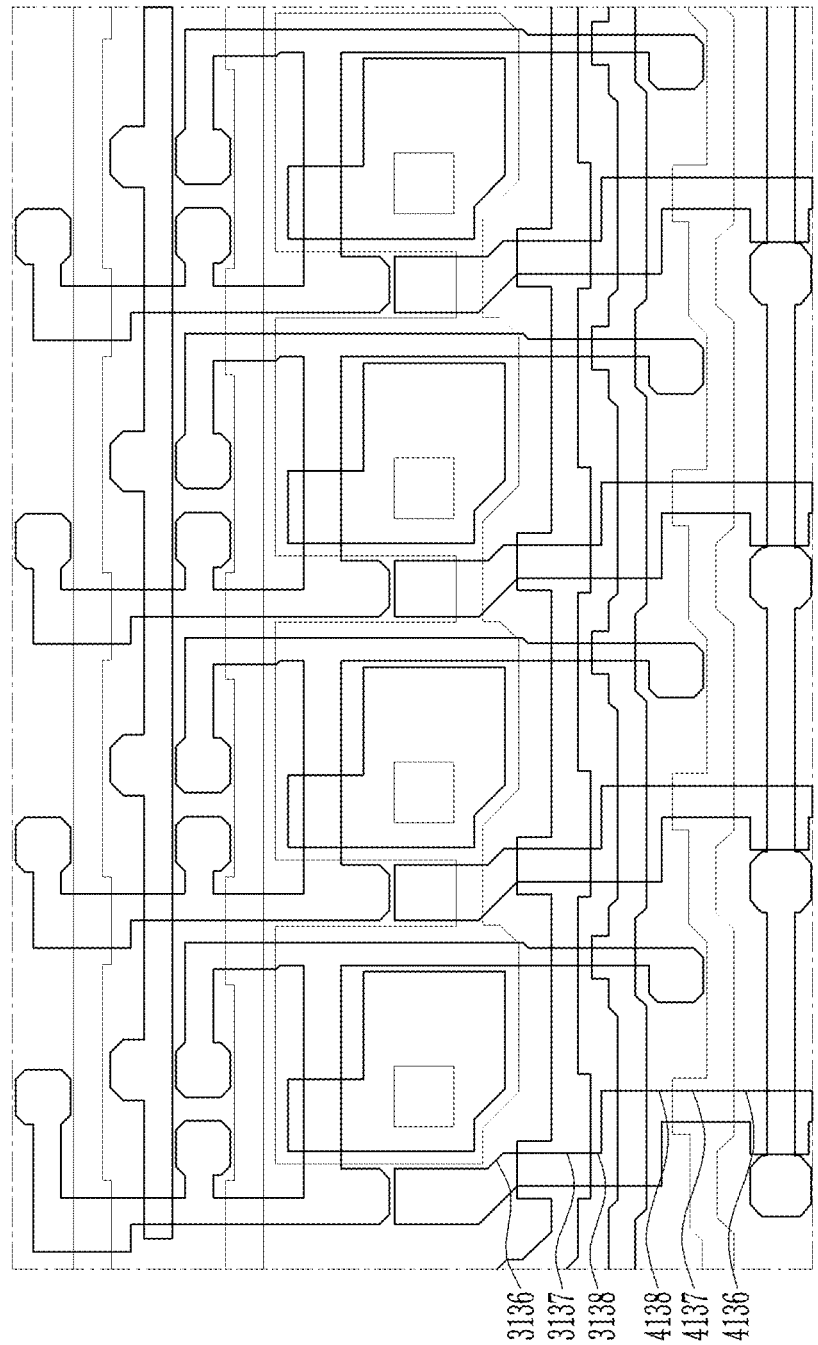

On the first interlayer insulating layer 161, an oxide semiconductor including a channel 3137, a first electrode 3136 and a second electrode 3138 of the third transistor T3, and a channel 4137, a first electrode 4136, and a second electrode 4138 of the fourth transistor T4, may be disposed. FIG. 27 shows the polycrystalline semiconductor, the first gate conductor, the second gate conductor, and the oxide semiconductor together.

The oxide semiconductor may further include the second electrode of the boost capacitor Cboost, and the second electrode of the boost capacitor Cboost may be connected to the second electrode 3138 of the third transistor T3 and the second electrode 4138 of the fourth transistor T4. A third gate insulating layer 143 may be disposed on the oxide semiconductor.

Figure 28:
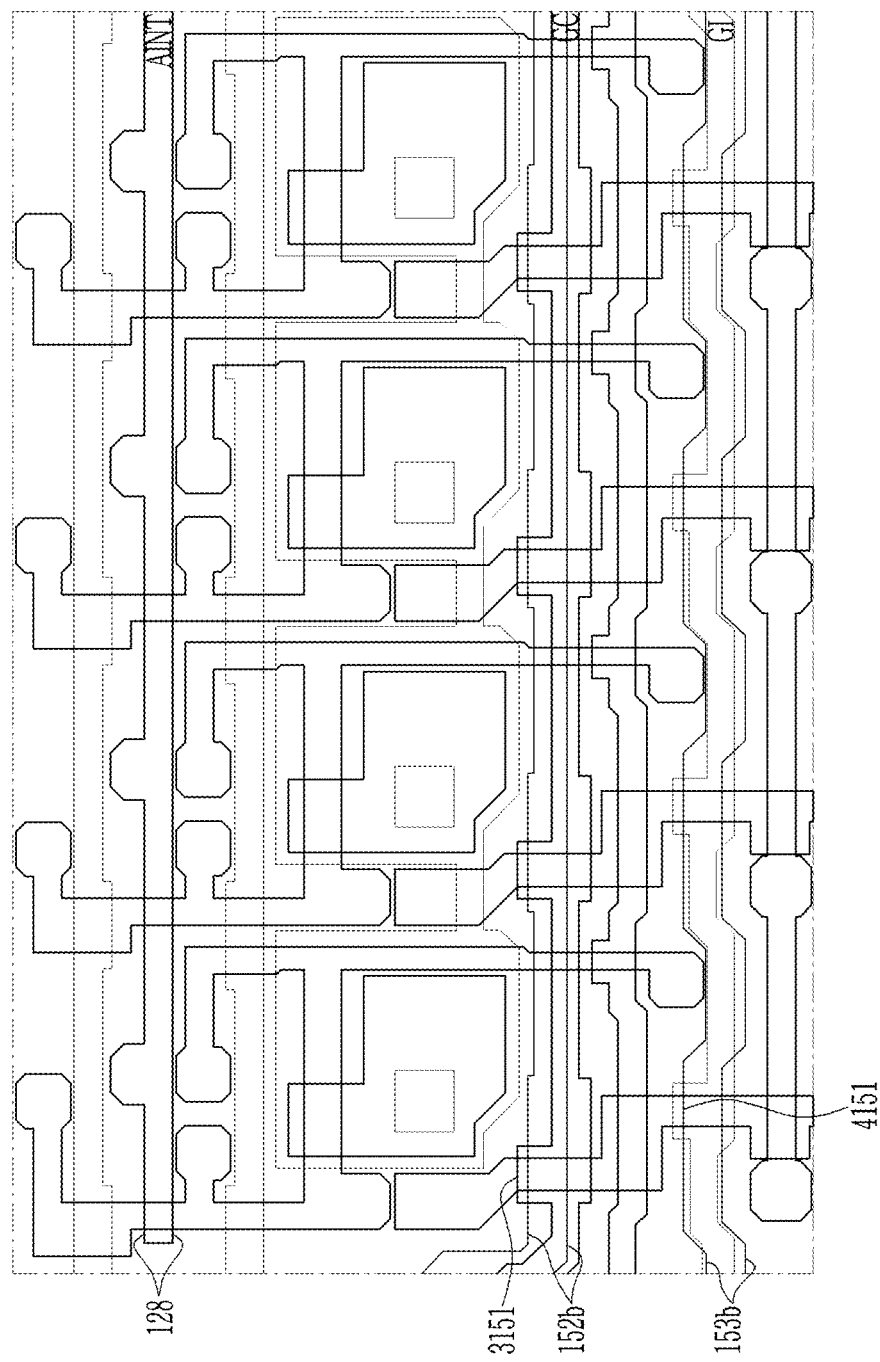

On the third gate insulating layer 143, a third gate conductor including a gate electrode 3151 of the third transistor T3 and a gate electrode 4151 of the fourth transistor T4 may be disposed. FIG. 28 shows the polycrystalline semiconductor, the first gate conductor, the second gate conductor, the oxide semiconductor, and the third gate conductor together.

The third gate conductor may further include a second initialization voltage line 128, an upper second scan line 152b, and an upper initialization control line 153b. A second interlayer insulating layer 162 may be disposed on the third gate conductor.

Figure 29:
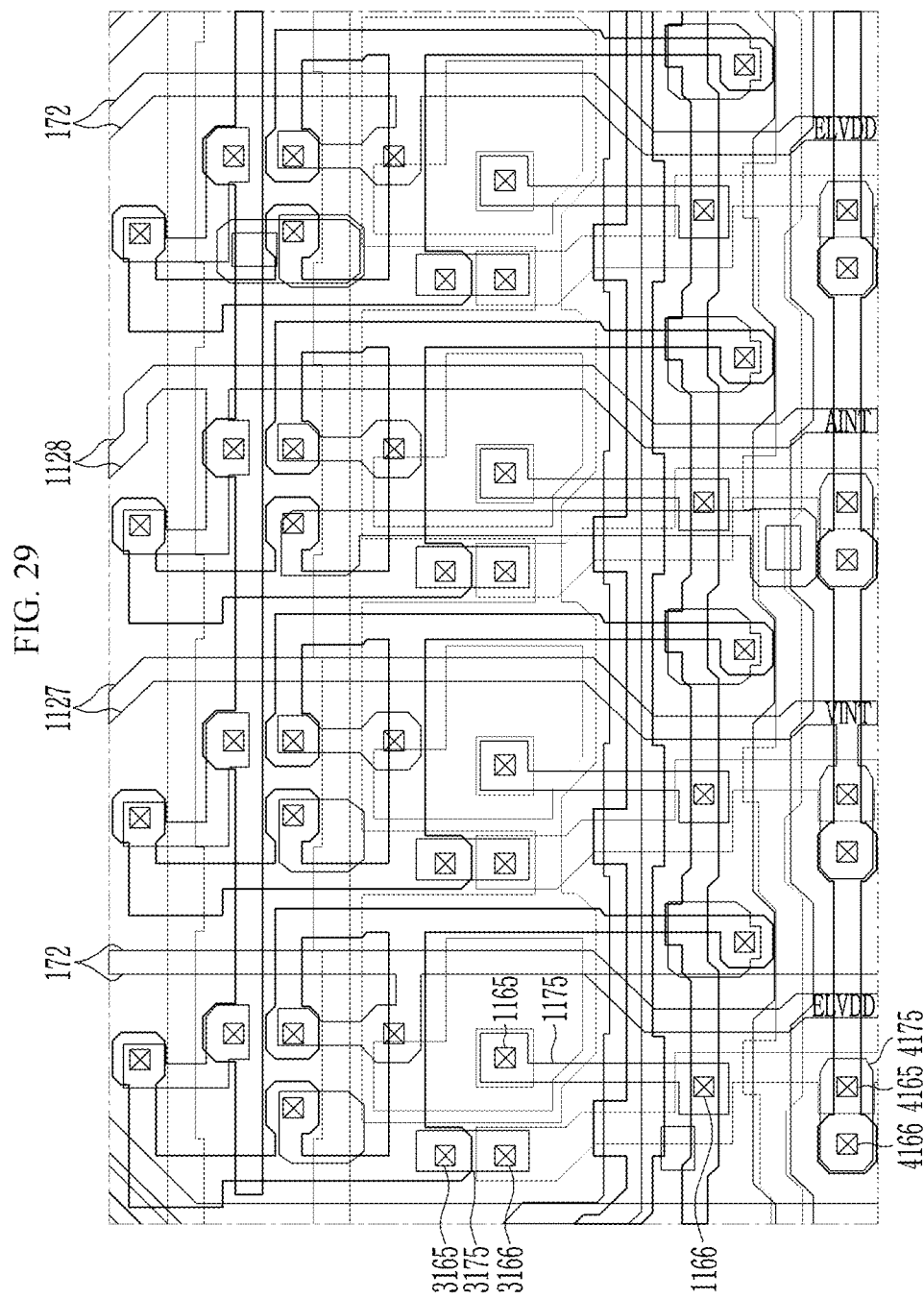

On the second interlayer insulating layer 162, a first data conductor including a first connection electrode 1175, a second connection electrode 3175, and a third connection electrode 4175 may be disposed. FIG. 29 shows the polycrystalline semiconductor, the first gate conductor, the second gate conductor, the oxide semiconductor, the third gate conductor, and the first data conductor together.

The first connection electrode 1175 may connect the gate electrode 1151 of the driving transistor T1, the second electrode 3138 of the third transistor T3, and the second electrode 4138 of the fourth transistor T4. The second connection electrode 3175 may connect the second electrode 1133 of the driving transistor T1 and the first electrode 3136 of the third transistor T3. The third connection electrode 4175 may connect the first electrode 4136 of the fourth transistor T4 and the first initialization voltage line 127.

The first data conductor may further include a driving voltage line 172, a first initialization voltage supply line 1127, and a second initialization voltage supply line 1128.

The driving voltage line 172 may extend approximately in the vertical direction and transmit the driving voltage ELVDD. The driving voltage line 172 may be connected to the fifth transistor T5 and the first storage electrode 1153 of the storage capacitor Cst2. The first storage electrodes 1153 of the storage capacitors Cst2 of four adjacent pixels PX may be connected to each other. Therefore, the driving voltage line 172 does not need to be disposed for every pixel column. For example, the driving voltage line 172 may be disposed one for every two pixel columns or one for every four pixel columns.

The first initialization voltage supply line 1127 may be extended approximately in the vertical direction, and may transmit the first initialization voltage VINT. The first initialization voltage supply line 1127 may be connected to the first initialization voltage line 127. The first initialization voltage line 127 is connected per each pixel PX to transmit the first initialization voltage VINT. The first initialization voltage supply line 1127 may be disposed one for every four pixel columns.

The second initialization voltage supply line 1128 may be extended approximately in the vertical direction and may transmit the second initialization voltage AINT. The second initialization voltage supply line 1128 may be connected to the second initialization voltage line 128. The second initialization voltage line 128 is connected for each pixel PX to transmit the second initialization voltage AINT. The second initialization voltage supply line 1128 may be disposed one for every four pixel columns.

A third interlayer insulating layer 180 may be disposed on the first data conductor. A data line 171 may be disposed on the third interlayer insulating layer 180. The data line 171 may extend substantially in the vertical direction, and may be connected to the second transistor T2 of each pixel PX.

Although not shown, a passivation layer, an anode, a partition wall, a light-emitting element layer, a cathode, etc. may be positioned on the data line 171.

The pixels PX of two adjacent rows in the second region DA2 of the display device according to an exemplary embodiment may have a vertically symmetrical structure. This is described with reference to FIG. 30.

Figure 30:
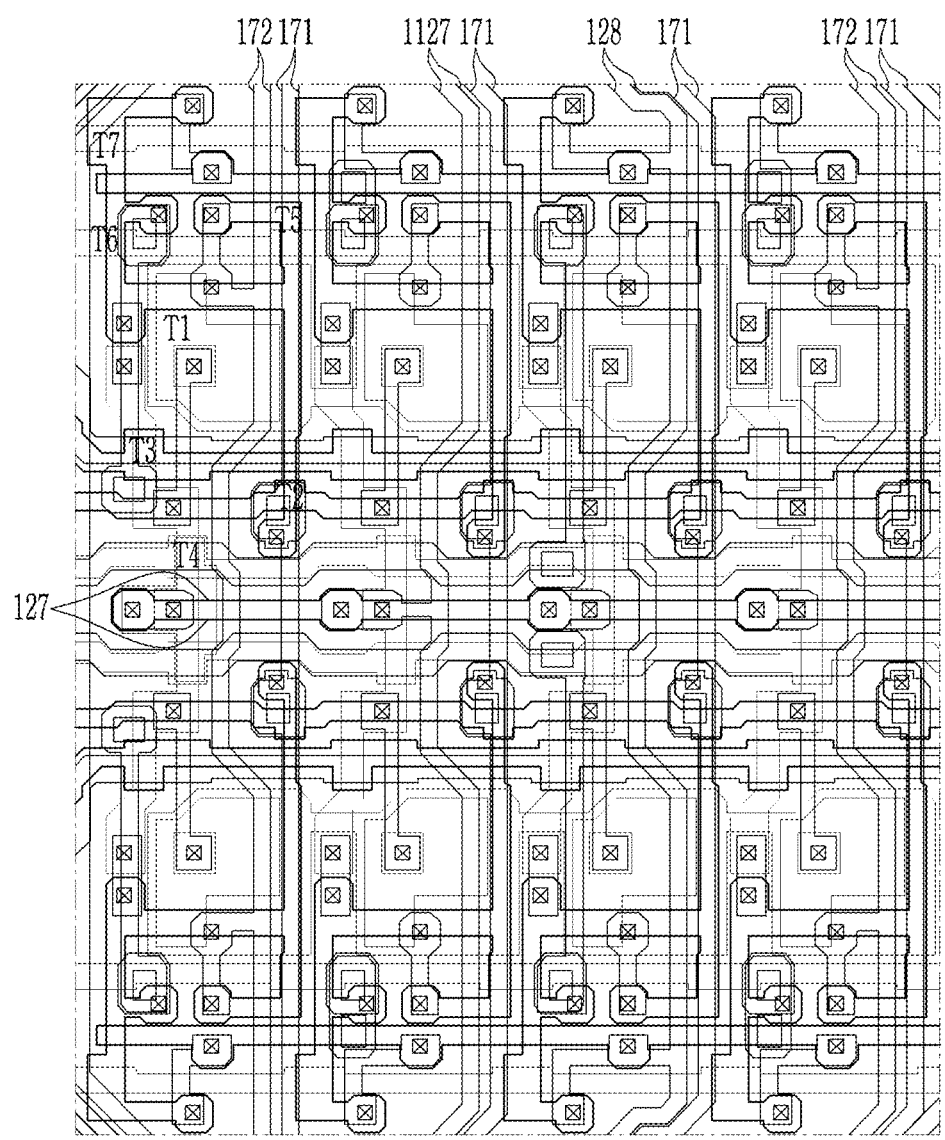
FIG. 30 is a top plan view showing some pixels of a second region of a display device according to an exemplary embodiment.

FIG. 30 is a top plan view showing some pixels of a second region of a display device according to an exemplary embodiment. FIG. 30 is a view showing four pixels shown in FIG. 21 and four pixels adjacent thereto together.

The pixel PX of the adjacent two rows in the second region DA2 of the display device according to an exemplary embodiment may have a flip structure that is symmetrical up and down based on the first initialization voltage line 127. Therefore, the eight adjacent pixels PX are connected to the same first initialization voltage line 127 to receive the first initialization voltage VINT. As described above, the number of wires disposed in the second region DA2 is reduced to increase transmittance of the second region DA2 compared to the first region DA1.

This is only an example, and instead of the first initialization voltage line 127, the pixels PX of two adjacent rows may be symmetrical based on other wires. For example, the pixels PX of two adjacent rows may be symmetrical based on the second initialization voltage line 128.

While this disclosure has been described in connection with what is presently considered to be practical exemplary embodiments, it is to be understood that the invention is not limited to the disclosed embodiments. On the contrary, it is intended to cover various modifications and equivalent arrangements included within the spirit and scope of the appended claims.

<Description of symbols>

| | |
|---|---|
| DA1: first region | DA2: second region |
| 127: first initialization voltage line | 128: second initialization voltage line |
| 151: first scan line | 152: second scan line |
| 153: initialization control line | 154: bypass control line |
| 155: light emission control line | 171: data line |
| 172: driving voltage line | 500: light blocking member |
| 741: common voltage line | |
| 1127: first initialization voltage supply line | 1128: second initialization voltage supply line |
| PX: pixel | |
| Cst: storage capacitor | Cas: auxiliary capacitor |

What is claimed is:

1. A display device, comprising:
a substrate;
a polycrystalline semiconductor layer on the substrate, the polycrystalline semiconductor layer including a channel, a first electrode, and a second electrode of a first transistor and a channel, a first electrode, and a second electrode of a second transistor;
a first gate conductor layer including a gate electrode of the first transistor overlapping the channel of the first transistor, and a gate electrode of the second transistor overlapping the channel of the second transistor;
an oxide semiconductor layer on the substrate, the oxide semiconductor layer including a channel, a first electrode, and a second electrode of a third transistor;
a second gate conductor layer including a lower gate electrode of the third transistor overlapping the channel of the third transistor;
a third gate conductor layer including an upper gate electrode of the third transistor overlapping the channel of the third transistor;
a first data conductor layer including a first initialization voltage supply line electrically connected to the second transistor, a second initialization voltage supply line, and a first connection electrode electrically connected to the second electrode of the third transistor and the gate electrode of the first transistor; and
a fourth transistor connected to the second initialization voltage supply line,
wherein the second initialization voltage supply line is disposed on the same layer as the first initialization voltage supply line.

2. The display device of claim 1, wherein
the fourth transistor is connected between the second initialization voltage supply line and the third transistor, and
the first initialization voltage supply line is disposed on the same layer as the first connection electrode.

3. The display device of claim 2, wherein
the oxide semiconductor layer further includes a channel, a first electrode, and a second electrode of the fourth transistor,
the second gate conductor layer further includes a lower gate electrode of the fourth transistor overlapping the channel of the fourth transistor,
the third gate conductor layer further includes an upper gate electrode of the fourth transistor overlapping the channel of the fourth transistor.

4. The display device of claim 2, further comprising:
a light emitting diode connected between a driving voltage line and a common voltage line;
a fifth transistor connected between the first electrode of the first transistor and a data line, the first electrode of the first transistor being connected to the driving voltage line; and
a storage capacitor connected between the driving voltage line and the gate electrode of the first transistor.

5. The display device of claim 4, wherein
the polycrystalline semiconductor layer further includes a channel, a first electrode, and a second electrode of the fifth transistor, and
the first gate conductor layer further includes a gate electrode of the fifth transistor.

6. The display device of claim 5, wherein the first electrode of the first transistor is extended to the second electrode of the fifth transistor.

7. The display device of claim 5, wherein
the second gate conductor further includes a first storage electrode of the storage capacitor, and
the first storage electrode overlaps the gate electrode of the first transistor.

8. The display device of claim 4, further comprising:
a sixth transistor connected between the driving voltage line and the first electrode of the first transistor; and
a seventh transistor connected between the second electrode of the first transistor and the light emitting diode.

9. The display device of claim 8, wherein
the polycrystalline semiconductor layer further includes a channel, a first electrode, and a second electrode of the sixth transistor, and
the first gate conductor layer further includes a gate electrode of the sixth transistor.

10. The display device of claim 9, wherein
the first electrode of the sixth transistor is connected to the driving voltage line, and
the second electrode of the sixth transistor is extended to the first electrode of the first transistor.

11. The display device of claim 9, wherein
the polycrystalline semiconductor layer further includes a channel, a first electrode, and a second electrode of the seventh transistor, and
the first gate conductor layer further includes a gate electrode of the seventh transistor.

12. The display device of claim 11, wherein
the first electrode of the seventh transistor is extended to the second electrode of the first transistor, and
the second electrode of the seventh transistor is connected to an anode of the light emitting diode.

13. The display device of claim 1, further comprising:
a light blocking member disposed on the substrate,
wherein the light blocking member is disposed between the substrate and the gate electrode of the first transistor.

* * * * *